(12) United States Patent
Yun

(10) Patent No.: US 10,425,039 B2
(45) Date of Patent: Sep. 24, 2019

(54) APPARATUS AND METHOD FOR CALIBRATING FREQUENCY OF OSCILLATOR IN RESPONSE TO EXTERNAL SIGNAL

(71) Applicant: Samsung Electronics Co., Ltd., Suwon-si (KR)

(72) Inventor: Seok Ju Yun, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 134 days.

(21) Appl. No.: 15/664,732

(22) Filed: Jul. 31, 2017

(65) Prior Publication Data
US 2018/0048263 A1  Feb. 15, 2018

(30) Foreign Application Priority Data

Aug. 9, 2016 (KR) .......................... 10-2016-0101050

(51) Int. Cl.
*H03B 5/12* (2006.01)
*H03L 7/093* (2006.01)
(Continued)

(52) U.S. Cl.
CPC ............ *H03B 5/1243* (2013.01); *H03L 7/00* (2013.01); *H03L 7/06* (2013.01); *H03L 7/093* (2013.01);
(Continued)

(58) Field of Classification Search
CPC .................................................... H03B 5/1243
(Continued)

(56) References Cited

U.S. PATENT DOCUMENTS 4,937,536 A * 6/1990 Reinhardt ............... H03L 7/107
331/17
7,453,927 B2  11/2008 Vepsäläinen et al.
(Continued)

FOREIGN PATENT DOCUMENTS

KR   10-2003-0034259 A   5/2003
KR   10-0414072 B1       1/2004
(Continued)

OTHER PUBLICATIONS

Chen, Wei-Zen, et al., "A 2.4 GHz Reference-less Wireless Receiver for 1Mbps QPSK Demodulation." *Proceedings of 2010 IEEE International Symposium on Circuits and Systems*, 2010 (pp. 1627-1630).
(Continued)

*Primary Examiner* — Joseph Chang
(74) *Attorney, Agent, or Firm* — NSIP Law

(57) ABSTRACT

A frequency calibrator includes an input signal generator configured to generate an input signal based on an oscillation signal and an external signal; a frequency difference extractor configured to extract, from the input signal, a frequency difference signal having a frequency corresponding to a frequency difference between an external frequency of the external signal and an oscillation frequency of the oscillation signal; a divider configured to generate a division signal by dividing a signal having the oscillation frequency by a division ratio; and a frequency tuner configured to tune the oscillation frequency of the oscillation signal based on a result of comparing the frequency difference signal to the division signal.

32 Claims, 19 Drawing Sheets

(51) Int. Cl.
*H03L 7/099* (2006.01)
*H03L 7/00* (2006.01)
*H03L 7/06* (2006.01)
*H03L 7/18* (2006.01)

(52) U.S. Cl.
CPC ............ *H03L 7/099* (2013.01); *H03L 7/18* (2013.01); *H03B 2200/004* (2013.01); *H03B 2200/0068* (2013.01)

(58) Field of Classification Search
USPC .......................................................... 331/8
See application file for complete search history.

(56) References Cited

U.S. PATENT DOCUMENTS

| | | |
|---|---|---|
| 2009/0278617 A1 | 11/2009 | Lee et al. |
| 2009/0316847 A1 | 12/2009 | Thomsen |
| 2009/0322400 A1 | 12/2009 | Kuo |
| 2013/0009682 A1 | 1/2013 | Kyles |
| 2015/0105033 A1 | 4/2015 | Modi et al. |

FOREIGN PATENT DOCUMENTS

| | | |
|---|---|---|
| KR | 10-2005-0067338 A | 7/2005 |
| KR | 10-2006-0074129 A | 7/2006 |
| KR | 10-0950649 B1 | 4/2010 |
| WO | WO 02/013369 A1 | 2/2002 |
| WO | WO 2006/018697 A1 | 2/2006 |
| WO | WO 2007/147132 A2 | 12/2007 |
| WO | WO 2010/093961 A1 | 8/2010 |

OTHER PUBLICATIONS

Sung, Wei-Hao, et al., "A Robust Frequency Tracking Loop for Energy-Efficient Crystalless WBAN Systems", *IEEE Transactions on Circuits and Systems II: Express Briefs*, vol. 58, Issue 10, 2011, (pp. 637-641).

Extended European Search Report dated Jan. 23, 2018 in corresponding European Patent Application No. 17184605.8 (11 pages in English).

Bohorquez, Jose L., Anantha P. Chandrakasan, and Joel L. Dawson. "A 350 μW CMOS MSK Transmitter and 400 μW OOK Super-Regenerative Receiver for Medical Implant Communications." IEEE Journal of Solid-State Circuits 44.4 (2009): 1248-1259.

Bae, Joonsung, et al. "A low-energy crystal-less double-FSK sensor node transceiver for wireless body-area network." IEEE Journal of Solid-State Circuits 47.11 (2012): 2678-2692.

* cited by examiner

APPARATUS AND METHOD FOR CALIBRATING FREQUENCY OF OSCILLATOR IN RESPONSE TO EXTERNAL SIGNAL

CROSS-REFERENCE TO RELATED APPLICATIONS

This application claims the benefit under 35 USC 119(a) of Korean Patent Application No. 10-2016-0101050 filed on Aug. 9, 2016, in the Korean Intellectual Property Office, the entire disclosure of which is incorporated herein by reference for all purposes.

BACKGROUND

1. Field

The following description relates to an apparatus and a method for calibrating a frequency.

2. Description of Related Art

A wireless transceiver operates using an oscillator that changes an oscillation frequency within a desired range. The oscillator may be an analog voltage-controlled oscillator that changes an oscillation frequency by changing a capacitance of a capacitor in an oscillation circuit based on a controlled voltage, for example, a voltage-controlled crystal oscillator (VCXO), or a digital oscillator that changes an oscillation frequency by connecting a fractional N-phase lock loop (PLL) circuit to a rear end of a simple packaged crystal oscillator (SPXO) and changing settings of the fractional N-PLL circuit through an external terminal.

Recently, in the field of medical science, there has been a demand for a miniaturized transceiver, and thus an oscillator also needs to be miniaturized.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a frequency calibrator includes an input signal generator configured to generate an input signal based on an oscillation signal and an external signal; a frequency difference extractor configured to extract, from the input signal, a frequency difference signal having a frequency corresponding to a frequency difference between an external frequency of the external signal and an oscillation frequency of the oscillation signal; a divider configured to generate a division signal by dividing a signal having the oscillation frequency by a division ratio; and a frequency tuner configured to tune the oscillation frequency of the oscillation signal based on a result of comparing the frequency difference signal to the division signal.

The input signal generator may include an oscillator configured to operate at the oscillation frequency; the oscillator may be further configured to receive the external signal, and output the input signal based on the external signal and the oscillation signal; and the frequency difference extractor may include an envelope detector configured to detect an envelope signal from the input signal.

The oscillation signal may be output from an oscillator; the input signal generator may include a frequency mixer configured to receive the oscillation signal and the external signal, and generate a mix signal as the input signal by mixing the oscillation signal and the external signal; and the frequency difference extractor may include a pass filter configured to pass a signal within a threshold frequency bandwidth in the mix signal.

The input signal generator may include an oscillator configured to operate at the oscillation frequency; and the oscillator may include a capacitor bank configured to tune the oscillation frequency.

The frequency tuner may be further configured to tune the oscillation frequency using a binary search based on the result of comparing the frequency difference signal to the division signal.

The input signal generator may include an oscillator including a varactor pair; and the frequency tuner may include an analog phase lock loop (PLL) including a phase frequency detector (PFD), a main charge pump (CP), and a loop filter (LF).

The frequency tuner may be further configured to tune the oscillation frequency to minimize a frequency difference between the frequency difference signal and the division signal.

The oscillation signal may be output from an oscillator; and the frequency tuner may be further configured to decrease a capacitance of the oscillator in response to a frequency of the division signal being less than the frequency of the frequency difference signal, and increase the capacitance of the oscillator in response to the frequency of the division signal being greater than the frequency of the frequency difference signal.

The oscillation signal may be output from an oscillator; and the division ratio may be determined based on the oscillation frequency, an injection current of the external signal, and an oscillation current of the oscillator.

The input signal generator may be further configured to receive the external signal having the external frequency within a predetermined frequency range; and the frequency tuner may be further configured to tune the oscillation frequency of the oscillation signal to a target frequency determined based on the division ratio and the external frequency.

The divider may be further configured to divide a signal generated by removing an envelope from the input signal by a division ratio N to obtain the division signal; and the frequency tuner may be further configured to tune the oscillation frequency of the oscillation signal to a frequency that is N/(N+1) times the external frequency, N being a real number greater than "0".

The frequency calibrator may further include a signal strength detector configured to detect a signal strength of the frequency difference signal; and the frequency calibrator may be configured to continue a frequency calibration in response to the signal strength of the frequency difference signal exceeding a threshold strength, and terminate the frequency calibration in response to the signal strength of the frequency difference signal being less than or equal to the threshold strength.

In another general aspect, a frequency calibration method includes generating an input signal based on an oscillation signal and an external signal; extracting, from the input signal, a frequency difference signal having a frequency corresponding to a frequency difference between an external frequency of the external signal and an oscillation frequency of the oscillation signal; generating a division signal by dividing a signal having the oscillation frequency by a division ratio; and tuning the oscillation frequency of the oscillation signal based on a result of comparing the frequency difference signal to the division signal.

The generating of the input signal may include receiving the external signal; and outputting the input signal based on the external signal and the oscillation signal; and the extracting may include detecting an envelope signal from the input signal as the frequency difference signal.

The generating of the input signal may include receiving the oscillation signal from an oscillator; receiving the external signal; and generating a mix signal as the input signal by mixing the oscillation signal and the external signal; and the extracting may include passing a signal within a threshold frequency bandwidth in the mix signal.

The tuning may include tuning the oscillation frequency using a binary search based on the result of comparing the frequency difference signal to the division signal.

The generating of the input signal may include receiving the external signal having the external frequency within a predetermined frequency range; and the tuning may include tuning the oscillation frequency to minimize a frequency difference between the frequency difference signal and the division signal.

The frequency calibration method may further include detecting a signal strength of the frequency difference signal; continuing a frequency calibration in response to the signal strength of the frequency difference signal exceeding a threshold strength; and terminating the frequency calibration in response to the signal strength of the frequency difference signal being less than or equal to the threshold strength.

In another general aspect, a non-transitory computer-readable medium stores instructions that, when executed by a processor, cause the processor to perform the method described above.

In another general aspect, a frequency calibration method includes generating an input signal based on an oscillation signal and an external signal; extracting, from the input signal, a frequency difference signal having a frequency corresponding to a frequency difference between an external frequency of the external signal and an oscillation frequency of the oscillation signal; and changing an oscillation frequency of an oscillator in one direction in response to a signal strength of the frequency difference signal exceeding a threshold strength.

In another general aspect, a frequency calibrator includes an input signal generator configured to generate an input signal based on an external signal and an oscillation signal generated by a crystal-less oscillator; a frequency difference extractor configured to extract, from the input signal, a frequency difference signal having a frequency corresponding to a frequency difference between an external frequency of the external signal and an oscillation frequency of the oscillation signal; and a frequency tuner configured to tune the oscillation frequency of the oscillation signal based on the frequency difference signal.

The frequency calibrator may further include a divider configured to generate a division signal by dividing a signal having the oscillation frequency by a division ratio; and the frequency tuner may be further configured to compare a frequency of the frequency difference signal to a frequency of the division signal, and tune the oscillation frequency of the oscillation signal based on a result of the comparing.

The frequency tuner may include a phase frequency detector configured to detect a frequency difference between the frequency of the frequency difference signal and the frequency of the division signal; a signal strength detector configured to detect a signal strength of the frequency difference signal; a processor configured to generate a control signal for tuning the oscillation frequency of the oscillator based on the frequency difference and the signal strength; and a frequency controller configured to tune the oscillation frequency of the oscillator based on the control signal and the signal strength.

The processor may include a binary searcher configured to generate the control signal by performing a binary search based on the frequency difference.

The input signal generator may include a varactor pair to tune the oscillation frequency of the oscillation signal; and the frequency tuner may includes a phase frequency detector configured to detect a frequency difference between the frequency of the frequency difference signal and the frequency of the division signal; and a charge pump and a loop filter configured to generate a control signal for tuning the oscillation frequency of the oscillator based on the frequency difference, and control the varactor pair based on the control signal to tune the oscillation frequency of the oscillator.

The frequency tuner may include a signal strength detector configured to detect a signal strength of the frequency difference signal; and a frequency controller configured to compare the signal strength of the frequency difference signal to a threshold, and tune the oscillation frequency of the oscillation signal based a result of the comparing.

The input signal generator may include a frequency mixer configured to mix the external signal and the oscillation signal to generate the input signal.

The frequency calibrator may further including a divider configured to generate a division signal by dividing a signal having the oscillation frequency by a division ratio; and the frequency tuner may be further configured to compare a frequency of the frequency difference signal to a frequency of the division signal, and tune the oscillation frequency of the oscillation signal based on a result of the comparing.

The frequency tuner may include a phase frequency detector configured to detect a frequency difference between the frequency of the frequency difference signal and the frequency of the division signal; and a processor configured to generate a control signal for tuning the oscillation frequency of the oscillator based on the frequency difference; and the frequency calibrator may further include a frequency controller configured to tune the oscillation frequency of the oscillator based on the control signal.

The processor may include a binary searcher configured to generate the control signal by performing a binary search based on the frequency difference.

The input signal generator may include a varactor pair to tune the oscillation frequency of the oscillation signal; and the frequency tuner may include a phase frequency detector configured to detect a frequency difference between the frequency of the frequency difference signal and the frequency of the division signal; and a charge pump and a loop filter configured to generate a control signal for tuning the oscillation frequency of the oscillator based on the frequency difference, and control the varactor pair based on the control signal to tune the oscillation frequency of the oscillator.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of functions and constructions that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only, and is not to be used to limit the disclosure. As used herein, the singular forms "a," "an," and "the" include the plural forms as well, unless the context clearly indicates otherwise. As used herein, the terms "comprise," include," and "have" and their various forms specify the presence of stated features, numbers, operations, elements, components, and/or combinations thereof, but do not preclude the presence or addition of one or more other features, numbers, operations, elements, components, and/or combinations thereof.

Unless otherwise defined, all terms, including technical and scientific terms, used herein have the same meaning as commonly understood in the art to which the disclosure pertains. Terms, such as those defined in commonly-used dictionaries, should be interpreted as having a meaning that is consistent with their meaning in the context of the relevant art, and are not to be interpreted in an idealized or overly formal sense unless expressly so defined herein.

Figure 1:
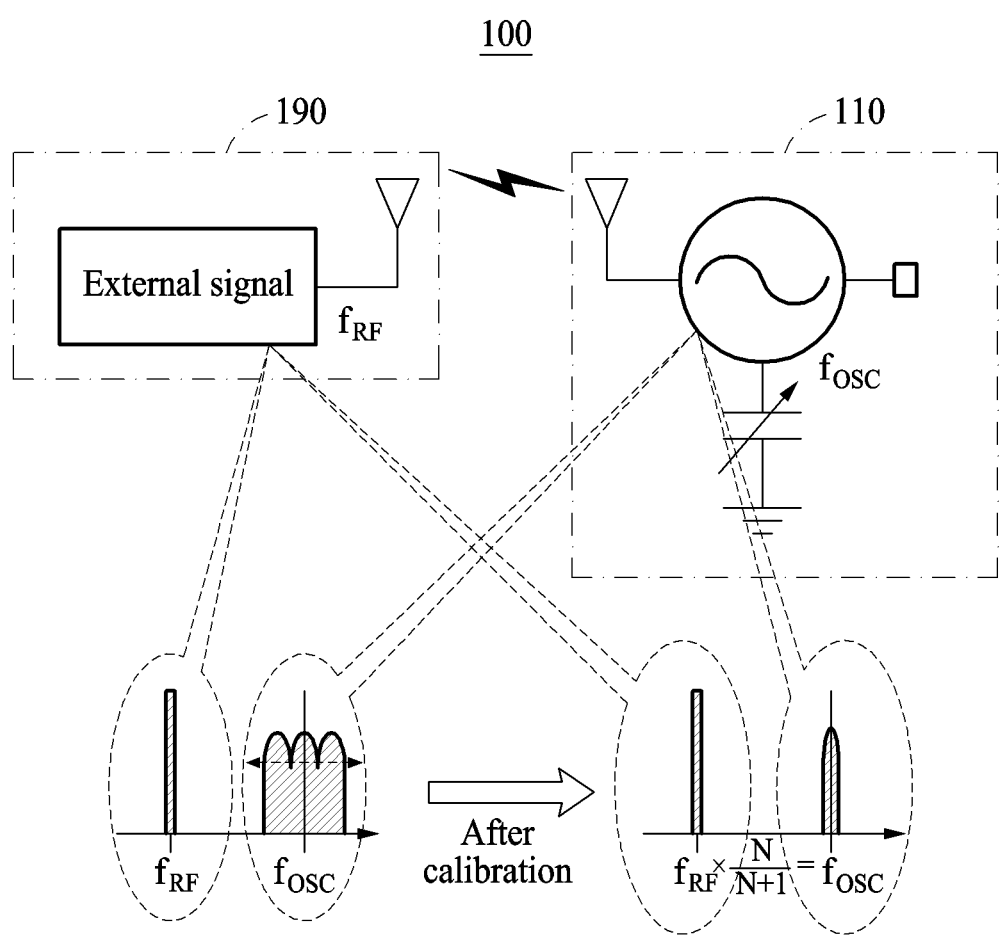
FIG. 1 illustrates an example of a frequency calibration system.

FIG. 1 illustrates an example of a frequency calibration system.

Referring to FIG. 1, a frequency calibration system 100 includes a signal transmitter 190 and a frequency calibrator 110.

The signal transmitter 190 transmits an external signal having an external frequency $f_{RF}$ to the frequency calibrator 110. The signal transmitter 190 generates the external signal having the external frequency $f_{RF}$ at a precise resolution, that is, at an exact desired frequency.

The frequency calibrator 110 tunes an oscillation frequency $f_{OSC}$ of an oscillator to a target frequency corresponding to the external frequency $f_{RF}$ in response to the external frequency $f_{RF}$ received from the signal transmitter 190. For example, the frequency calibrator 110 changes a resonant frequency of an LC tank of the oscillator by changing a capacitance of a capacitor of the LC tank, thereby tuning the oscillation frequency $f_{OSC}$ of the oscillator to the target frequency. In this application, the target frequency is a final oscillation frequency at which the oscillator operates in response to the external frequency $f_{RF}$ after frequency tuning is performed by the frequency calibrator 110. The target frequency is determined based on a division ratio and the external frequency $f_{RF}$. The oscillation frequency will be precisely tuned to the target frequency corresponding to the external frequency $f_{RF}$ of the external signal received by the frequency calibrator 110, and will be as accurate as the external frequency $f_{RF}$ within a resolution determined by the capacitor of the LC tank. If the capacitance of the capacitor of the LC tank can only be changed in discrete steps, the resolution of the oscillation frequency will be limited by the size of one step of the capacitor bank.

As shown in FIG. 1, the frequency calibrator 110 tunes the oscillation frequency $f_{OSC}$ of the oscillator. For example, the frequency calibrator 110 tunes the oscillation frequency $f_{OSC}$ of the oscillator to a frequency that is N/(N+1) times the external frequency $f_{RF}$ based on the external signal having the external frequency $f_{RF}$. The finally tuned oscillation frequency is expressed by Equation 2 described below with reference to FIG. 4.

The frequency calibrator 110 tunes the oscillation frequency to a target frequency based on the external frequency $f_{RF}$ of the external signal and the oscillation frequency $f_{OSC}$ of the oscillator without using an additional reference frequency. Thus, the frequency calibrator 110 is a device operating without a crystal (X-TAL) to generate a reference frequency, that is, a XTAL-less device. The frequency calibrator 110 operates without a crystal, and thus can be implemented in an ultra-small size having a very small form factor. Further, since the frequency calibrator 110 does not need a crystal, it operates with a low power.

The frequency calibrator 110 is implemented in a radio-frequency integrated circuit (RFIC), or implemented as a wireless transceiver having a small form factor. Further, the frequency calibrator 110 is applicable to technical fields in which a wireless transceiver needs to be miniaturized, for example, the field of Internet of Things (IoT), the field of medical implant communications system (MICS), a small-sized sensor system requiring wireless communication, or a low-power communication system. Accordingly, a number and sizes of external components to be used in the wireless transceiver need to be minimized. The frequency calibrator 110 does not require a reference oscillator, for example, a crystal, to generate a reference frequency, and thus the form factor of the frequency calibrator 110 greatly decreases. In addition, the frequency calibrator 110 accurately calibrates a frequency of an oscillator in a chip in response to an external signal received through an antenna, without using a reference oscillator in the chip or an external crystal. Thus, the frequency calibrator 110 occupies a small module area of the wireless transceiver, thereby contributing to miniaturization of the wireless transceiver.

Figure 2:
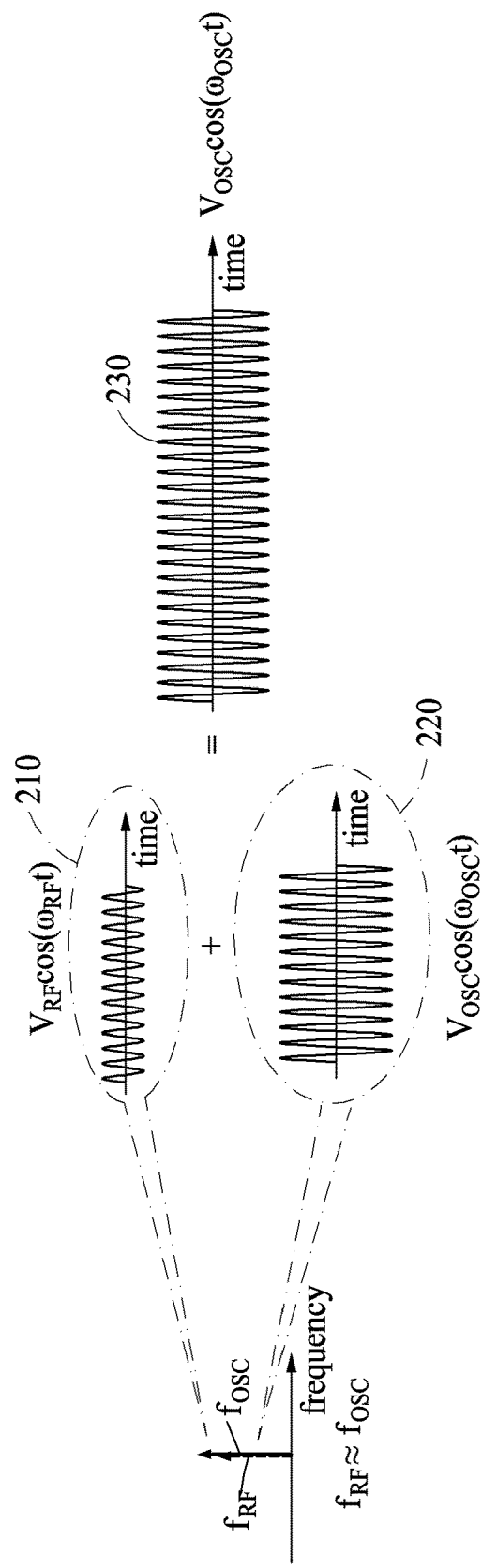
FIGS. 2 and 3 illustrate examples of input signals generated by a frequency calibrator.
Figure 3:
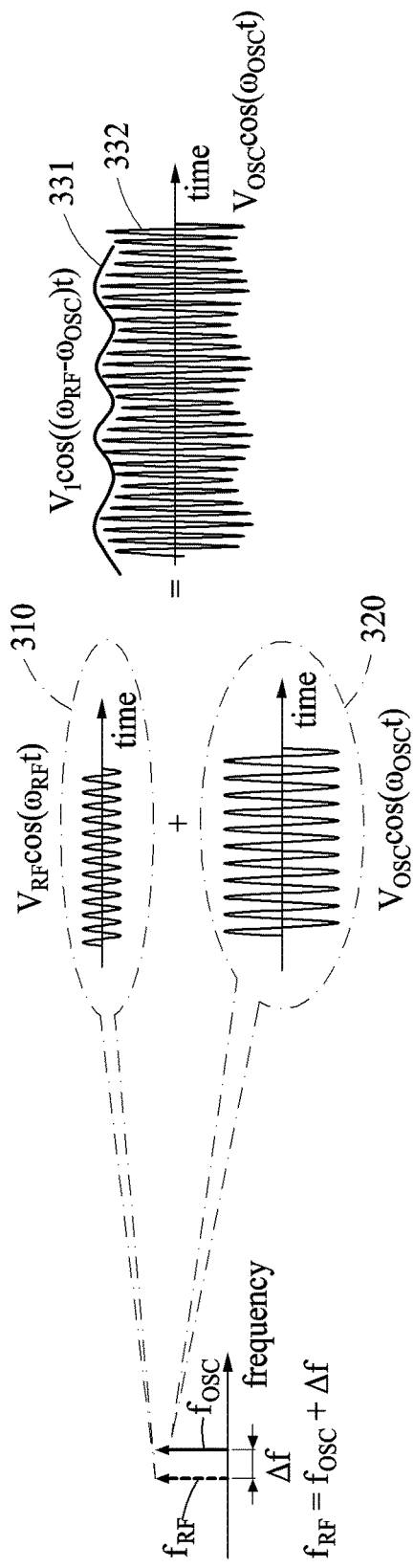

FIGS. 2 and 3 illustrate examples of input signals generated by a frequency calibrator.

FIG. 2 illustrates an input signal 230 generated by an oscillator in response to an external frequency $f_{RF}$ of an external signal 210 received by a frequency calibrator being the same as, or substantially the same as, an oscillation frequency $f_{OSC}$ of the oscillator.

In this application, the external frequency $f_{RF}$ may be expressed as an angular frequency $\omega_{RF}=2\pi f_{RF}$. For example, $f_{RF}$ and $\omega_{RF}$ may be interchangeably used as symbols representing the external frequency. Further, the oscillation frequency $f_{OSC}$ also may be expressed as an angular frequency $\omega_{OSC}=2\pi f_{OSC}$. For example, $f_{OSC}$ and $\omega_{OSC}$ may be interchangeably used as symbols representing the oscillation frequency.

Further, in this application, $V_{RF}$ represents a voltage amplitude of the external signal 210, and $V_{OSC}$ represents a voltage amplitude of an oscillation signal 220. The external signal 210 and the oscillation signal 220 are expressed as cosine functions. For example, as shown in FIG. 2, the external signal 210 is expressed as $V_{RF} \cos(\omega_{RF}t)$, and the oscillation signal 220 is expressed as $V_{OSC} \cos(\omega_{OSC}t)$. However, the time variable t may be omitted.

The oscillator of the frequency calibrator generates the input signal 230 based on the external signal 210 and the oscillation signal 220. In response to the external frequency $f_{RF}$ being the same as, or substantially the same as, the oscillation frequency $f_{OSC}$, the external frequency $f_{RF}$ of the external signal 210 is locked to the oscillation frequency $f_{OSC}$ of the oscillator. In response to the external frequency $f_{RF}$ being locked to the oscillation frequency $f_{OSC}$, the oscillator generates the oscillation signal 220 as the input signal 230 as shown in FIG. 2. Thus, the external frequency $f_{RF}$ does not appear in the input signal 230 generated by the oscillator included in the frequency calibrator. The oscillation frequency $f_{OSC}$ of the oscillation signal 220 corresponds to a resonant frequency determined based on an inductance and a capacitance of an LC tank of the oscillator.

FIG. 3 illustrates an input signal generated by an oscillator in response to an external frequency $f_{RF}$ of an external signal received by a frequency calibrator being different from an oscillation frequency $f_{OSC}$ of the oscillator.

Referring to FIG. 3, in response to a predetermined frequency difference $\Delta f$ between the oscillation frequency $f_{OSC}$ and the external frequency $f_{RF}$, that is, in response to $f_{RF}=f_{OSC}+\Delta f$ being satisfied, the oscillator generates, as an input signal 332, a signal in which an external signal 310 and an oscillation signal 320 are mixed. For example, the input signal 332 includes a component corresponding to a frequency difference 331 $f_{RF}$-$f_{OSC}$, which is shown as $\omega_{RF}$-$\omega_{OSC}$ in FIG. 3, that is, a frequency difference signal, and a component corresponding to the oscillation frequency $f_{OSC}$, which is shown as $\omega_{OSC}$ in FIG. 3, that is, a signal having the oscillation frequency $f_{OSC}$. The predetermined frequency difference $\Delta f$ may be expressed as $\Delta\omega=2\pi\Delta f$ in angular frequency form.

To operate the oscillator at a desired operating frequency, a signal transmitter transmits the external signal 310 having the external frequency $f_{RF}$ to the frequency calibrator. The frequency calibrator generates the input signal 332 based on the external signal 310 and the oscillation signal 320, and tunes the oscillation frequency $f_{OSC}$ of the oscillator based on the frequency components included in the input signal 332. For example, the frequency calibrator extracts a frequency difference signal from the input signal 332 using an envelope detector (ED), removes the frequency difference signal from the input signal 332 to obtain signal having the oscillation frequency, divides the oscillation frequency using a divider to obtain a division signal, and uses the division signal and the frequency difference signal for frequency tuning. The frequency calibrator tunes the oscillation frequency by directly performing a frequency-to-frequency comparison with respect to the division signal and the frequency difference signal in real time, thereby performing a precise frequency calibration.

Figure 4:
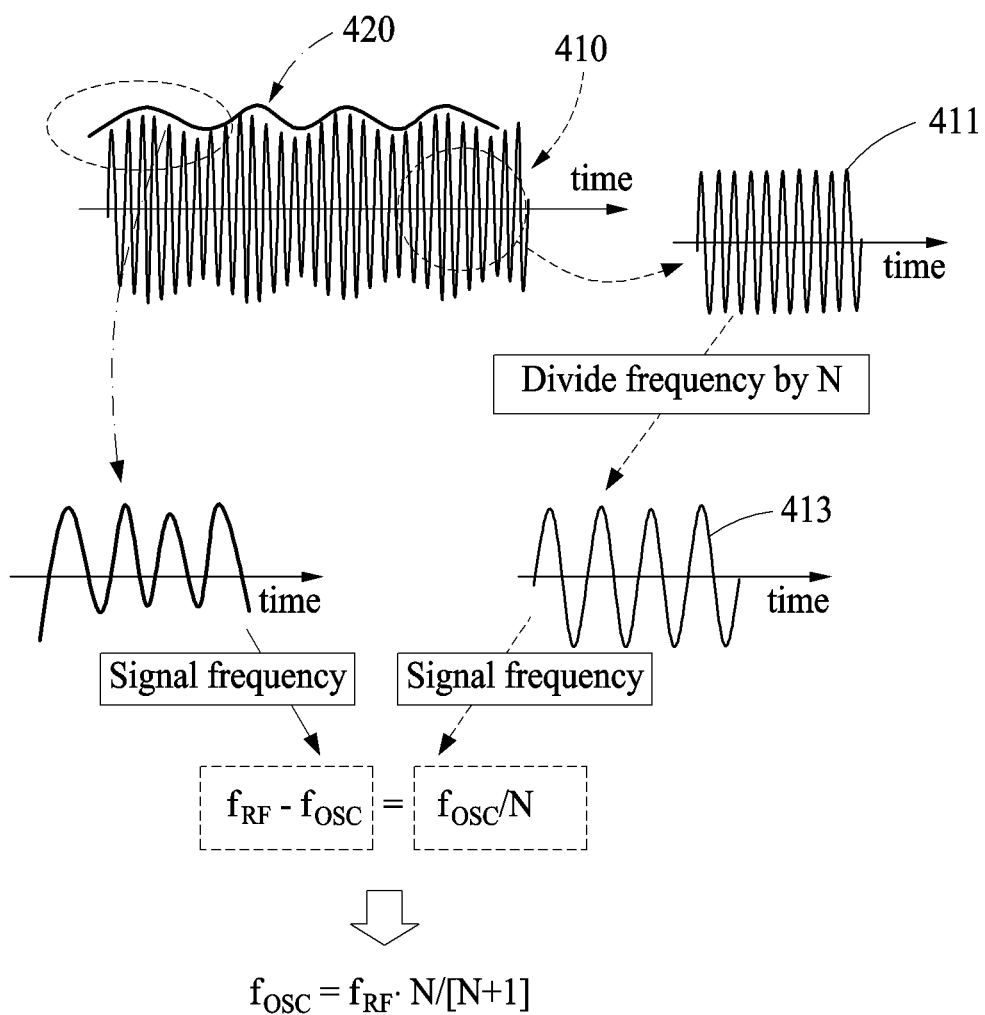
FIG. 4 illustrates an example of a final oscillation frequency determined by a frequency calibrator.

FIG. 4 illustrates an example of a final oscillation frequency determined by a frequency calibrator.

Referring to FIG. 4, a frequency calibrator generates an input signal 410 based on an external signal and an oscillation signal through an oscillator. The frequency calibrator extracts, from the input signal 410, an envelope signal 420 and a signal 411 generated by removing the envelope signal 420 from the input signal 410, hereinafter referred to as the envelope-removed signal 411. The input signal 410 is an amplitude-modulated (AM) signal generated by mixing the external signal and the oscillation signal, and is a signal in which the oscillation signal is amplitude-modulated by the envelope signal. As described above, the input signal 410 includes a component corresponding to the oscillation frequency $f_{OSC}$ and a component corresponding to the frequency difference $f_{RF}$-$f_{OSC}$.

For example, the envelope-removed signal 411 is a signal having the oscillation frequency $f_{OSC}$, and thus corresponds to a carrier signal used in amplitude modulation. The frequency calibrator divides the envelope-removed signal 411 by a division ratio N, N being a real number greater than "0". A frequency of a division signal 413 obtained by dividing the oscillation frequency $f_{OSC}$ by the division ratio N is $f_{OSC}/N$.

Further, the envelope signal 420 is a frequency difference signal having a frequency $f_{RF}$-$f_{OSC}$ corresponding to a frequency difference between the external frequency $f_{RF}$ of the external signal and the oscillation frequency $f_{OSC}$ of the oscillation signal.

The frequency calibrator tunes the oscillation frequency $f_{OSC}$ so that the frequency $f_{OSC}/N$ obtained by dividing the oscillation frequency by N and the frequency difference $f_{RF}$-$f_{OSC}$ are equal. For example, after the frequency calibrator has completed frequency tuning, the external frequency $f_{RF}$ of the external signal and the oscillation frequency $f_{OSC}$ of the oscillator satisfy the following Equations 1 and 2. Equations 1 and 2 are in an equivalent relationship.

$$f_{RF} - f_{OSC} = \frac{f_{OSC}}{N} \tag{1}$$

$$f_{OSC} = f_{RF} \cdot \frac{N}{N+1} \qquad (2)$$

The oscillation frequency $f_{OSC}$ of Equations 1 and 2 represents a final oscillation frequency determined by the frequency calibrator. In Equations 1 and 2, N denotes a division ratio that is a real number greater than "0".

Figure 5:
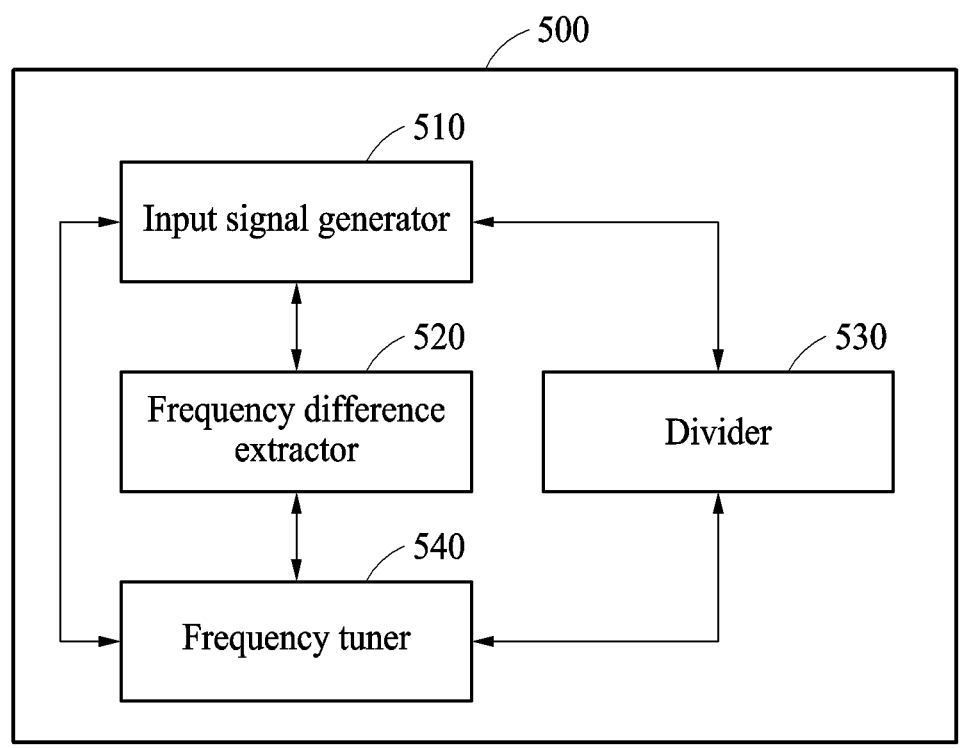
FIG. 5 illustrates an example of a configuration of a frequency calibrator.

FIG. 5 illustrates an example of a configuration of a frequency calibrator.

Referring to FIG. 5, a frequency calibrator 500 includes an input signal generator 510, a frequency difference extractor 520, a divider 530, and a frequency tuner 540.

The input signal generator 510 generates an input signal based on an oscillation signal and an external signal. The input signal generator 510 receives the external signal having an external frequency within a predetermined frequency range. The predetermined frequency range is a range of frequencies set for the frequency calibrator 500 to receive the external signal. In the examples illustrated in FIGS. 6A, 6B, 7, 8, and 15, the input signal generator 510 generates the input signal using a super-regenerative oscillator (SRO). In the examples illustrated in FIGS. 11 and 12, the input signal generator 510 generates the input signal using a frequency mixer.

The frequency difference extractor 520 extracts, from the input signal, a frequency difference signal having a frequency corresponding to a frequency difference between the external frequency of the external signal and an oscillation frequency of the oscillation signal.

The frequency difference extractor 520 includes an ED configured to detect an envelope signal from the input signal. The frequency difference extractor 520 including the ED will be described in detail with reference to FIGS. 6A, 6B, 7, 8, and 15.

In another example, the input signal generator 510 includes a frequency mixer configured to receive the oscillation signal output from an oscillator and the external signal, and generate a mix signal as the input signal by mixing the oscillation signal and the external signal. In this example, the frequency difference extractor 520 includes a pass filter configured to pass a signal within a threshold frequency bandwidth in the mix signal. The frequency difference extractor 520 including the pass filter will be described in detail with reference to FIGS. 11 and 12.

The divider 530 generates a division signal by dividing a signal having the oscillation frequency by a division ratio. The divider 530 divides a signal generated by removing an envelope from the input signal by a division ratio N to generate the division signal. The division signal has a frequency that is 1/N times the frequency of the signal that was divided. For example, the division ratio is determined based on the oscillation frequency, an injection current of the external signal, and an oscillation current of the oscillator as described below with reference to FIG. 10.

The frequency tuner 540 tunes the oscillation frequency of the oscillation signal based on a result of comparing the frequency difference signal to the division signal. The frequency tuner 540 tunes the oscillation frequency of the oscillation signal to a target frequency determined based on the division ratio and the external frequency. For example, the target frequency is a frequency that is N/(N+1) times the external frequency. The frequency tuner 540 tunes the oscillation frequency of the oscillation signal to the frequency that is N/(N+1) times the external frequency. N is a real number greater than "0".

In one example, the frequency tuner 540 tunes the oscillation frequency to minimize a frequency difference between the frequency difference signal and the division signal. In response to the frequency of the division signal being less than the frequency of the frequency difference signal, the frequency tuner 540 decreases a capacitance of the oscillator in discrete steps. In response to the frequency of the division signal being greater than the frequency of the frequency difference signal, the frequency tuner 540 increases the capacitance of the oscillator in discrete steps. The frequency tuner 540 tunes the oscillation frequency by performing a binary search based on the result of comparing the frequency difference signal to the division signal. For example, the frequency tuner 540 determines whether to increase or decrease the capacitance based on the binary search, thereby tuning the oscillation frequency. Adjustment of the capacitance using the binary search will be described in detail with reference to FIG. 9.

In another example, the frequency tuner 540 is an analog phase lock loop (PLL) including a phase frequency detector (PFD), a main charge pump (CP), and a loop filter (LF). In this example, the oscillator includes a varactor pair. The oscillation frequency of the oscillator is tuned continuously, i.e., not in discrete steps.

Figure 6A:
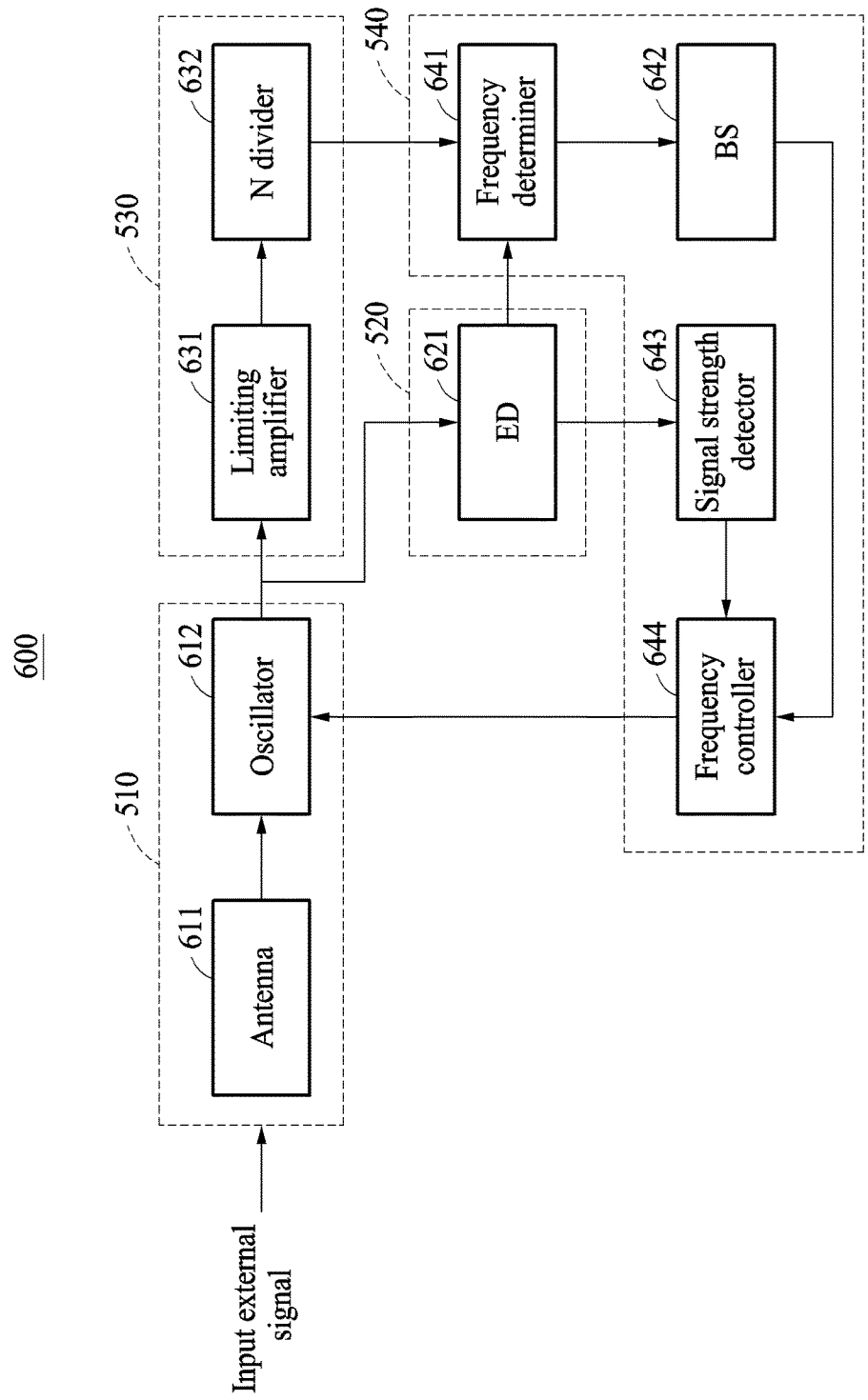
FIGS. 6A and 6B illustrate other examples of a configuration of a frequency calibrator.
Figure 6B:
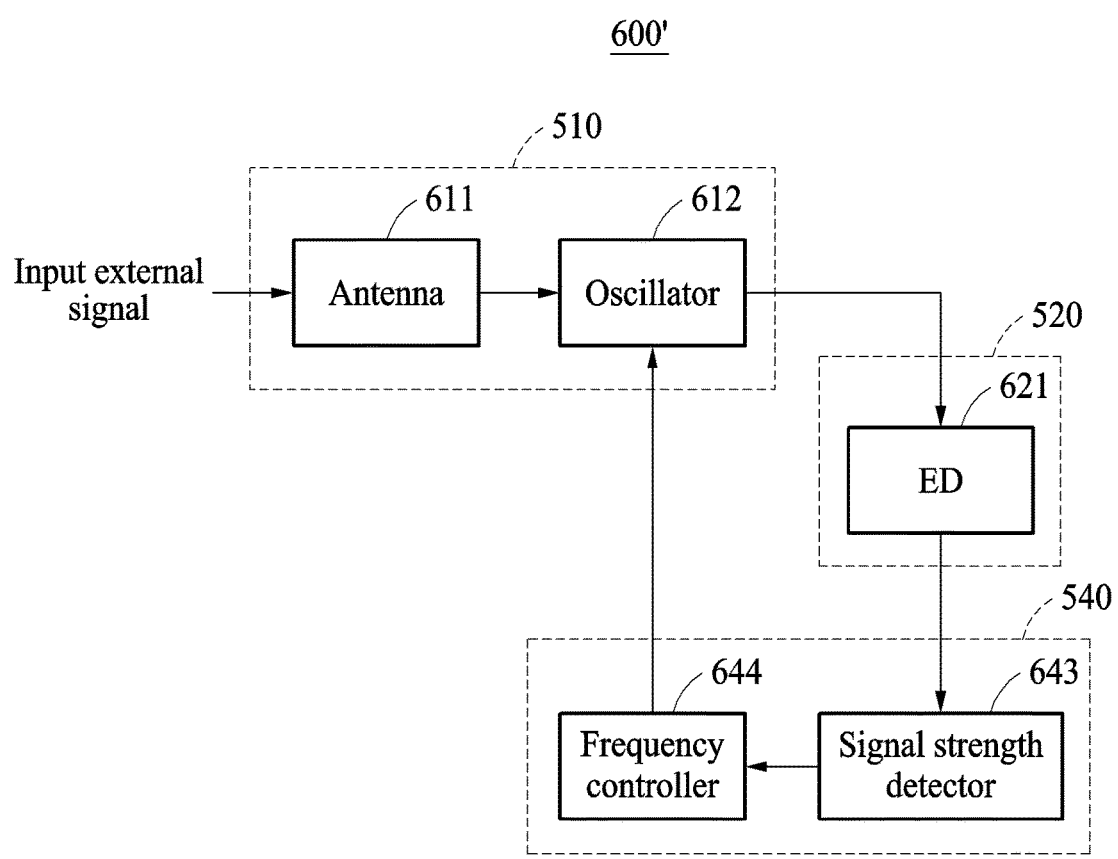

FIGS. 6A and 6B illustrate other examples of a configuration of a frequency calibrator.

FIG. 6A illustrates a configuration of a frequency calibrator 600 controlling an oscillation frequency based on an envelope signal and a division signal.

The input signal generator 510 includes an antenna 611 and an oscillator 612.

The antenna 611 receives an external signal. For example, the antenna 611 is designed to have a form and structure to receive the external signal having an external frequency within a predetermined frequency range.

The oscillator 612 is configured to operate at an oscillation frequency. For example, the oscillator 612 receives the external signal, and outputs an input signal based on the external signal and the oscillation signal. The oscillator 612 is also referred to as a super-regenerative oscillator (SRO).

The frequency difference extractor 520 includes an ED 621.

The ED 621 detects an envelope in the input signal output from the oscillator 612. An envelope frequency of an envelope signal detected by the ED 621 corresponds to a frequency difference between the external frequency of the external signal and the oscillation frequency of the oscillation signal.

The divider 530 includes a limiting amplifier 631 and an N divider 632.

The limiting amplifier 631 removes the envelope from the input signal generated by the input signal generator 510. For example, the limiting amplifier 631 removes the envelope from the input signal, thereby extracting a component having only the oscillation frequency from the input signal. The limiting amplifier 631 outputs the extracted signal having only the oscillation frequency to the N divider 632.

The N divider 632 divides the signal generated by removing the envelope from the input signal by a division ratio N. For example, the N divider 632 divides the oscillation frequency by the division ratio N, thereby generating a division signal.

The frequency tuner 540 includes a frequency determiner 641, a binary searcher (BS) 642, a signal strength detector 643, and a frequency controller 644. Further, the frequency controller 644 includes a variable capacitor (not shown)

configured to tune the oscillation frequency of the oscillator 612. The capacitor may be a capacitor bank (not shown) or a varactor pair (not shown).

The frequency determiner 641 compares the division signal to the envelope signal. The frequency determiner 641 performs a frequency-to-frequency comparison with respect to the two signals. For example, the frequency determiner 641 calculates a frequency difference between the frequency of the division signal obtained by dividing the oscillation frequency and the envelope frequency of the envelope signal.

The BS 642 may be implemented by a processor, and controls the frequency controller 644 based on the frequency difference between the division signal and the envelope signal calculated by the frequency determiner 641. For example, the BS 642 generates a control signal to control the frequency controller 644, and outputs the control signal to the frequency controller 644.

The control signal is a signal to control a capacitance of the variable capacitor included in the frequency controller 644. For example, in an example in which the frequency controller 644 is a digital device and the frequency controller 644 includes a capacitor bank, the BS 642 generates a digital control code as the control signal. The digital control code is digital information including bits that indicate values corresponding to the capacitance of the capacitor bank. In an example in which the frequency controller 644 is an analog device and the frequency controller 644 includes a varactor pair, the BS 642 generates a control voltage and a control current as the control signal.

The frequency controller 644 tunes the oscillation frequency of the oscillator 612 based on the control signal. For example, the frequency controller 644 adjusts the capacitance of the capacitor bank or the varactor pair to a value corresponding to the control signal. Although the frequency controller 644 is included in the frequency tuner 540 in the example in FIG. 6A, this is merely one example, and other examples are possible. In another example, the frequency controller 644 is included in the oscillator 612 rather than in the frequency tuner 540 as shown in FIG. 6A.

The frequency tuner 540 further includes the signal strength detector 643. The signal strength detector 643 detects a signal strength of the frequency difference signal. Based on the signal strength detected by the signal strength detector 643, the frequency controller 644 of the frequency calibrator 600 determines whether to perform a frequency calibration. The frequency controller 644 receives the detected signal strength from the signal strength detector 643. In response to the signal strength exceeding a threshold strength, the frequency controller 644 continues the frequency calibration. In response to the signal strength being less than the threshold strength, the frequency controller 644 terminates the frequency calibration.

However, the configuration of the frequency calibrator 600 is not limited to the example in FIG. 6A. In other examples, the detailed configuration may vary. In another example, the input signal generator 510 includes an oscillator configured to output an oscillation signal having an oscillation frequency determined irrespective of an external signal, and a frequency mixer configured to generate an input signal by mixing the oscillation signal and the external signal. In an example using the frequency mixer, the frequency difference extractor 520 includes a pass filter configured to pass a signal within a threshold frequency band in the mix signal. The threshold frequency band is a predetermined band of frequencies of the envelope signal.

FIG. 6B illustrates an example of a configuration of a frequency calibrator 600' controlling an oscillation frequency based on an envelope signal.

Referring to FIG. 6B, the frequency calibrator 600' includes the input signal generator 510, the frequency difference extractor 520, and the frequency tuner 540. The frequency tuner 540 includes the signal strength detector 643 and the frequency controller 644. Unlike the frequency calibrator 600 of FIG. 6A, the frequency calibrator 600' of FIG. 6B tunes the oscillation frequency based on the frequency difference signal, for example, the envelope signal. In response to a signal strength of the frequency difference signal exceeding a threshold strength, the frequency controller 644 continuously increases the oscillation frequency. In response to the signal strength of the frequency difference signal being less than or equal to the threshold strength, the frequency controller 644 terminates increasing the oscillation frequency. Conversely, while the signal strength of the frequency difference signal exceeds the threshold strength, the frequency controller 644 continuously decreases the oscillation frequency. In response to the signal strength of the frequency difference signal being less than or equal to the threshold strength, the frequency controller 644 terminates decreasing the oscillation frequency. Detailed descriptions will be provided with reference to FIGS. 16A and 16B.

Figure 7:
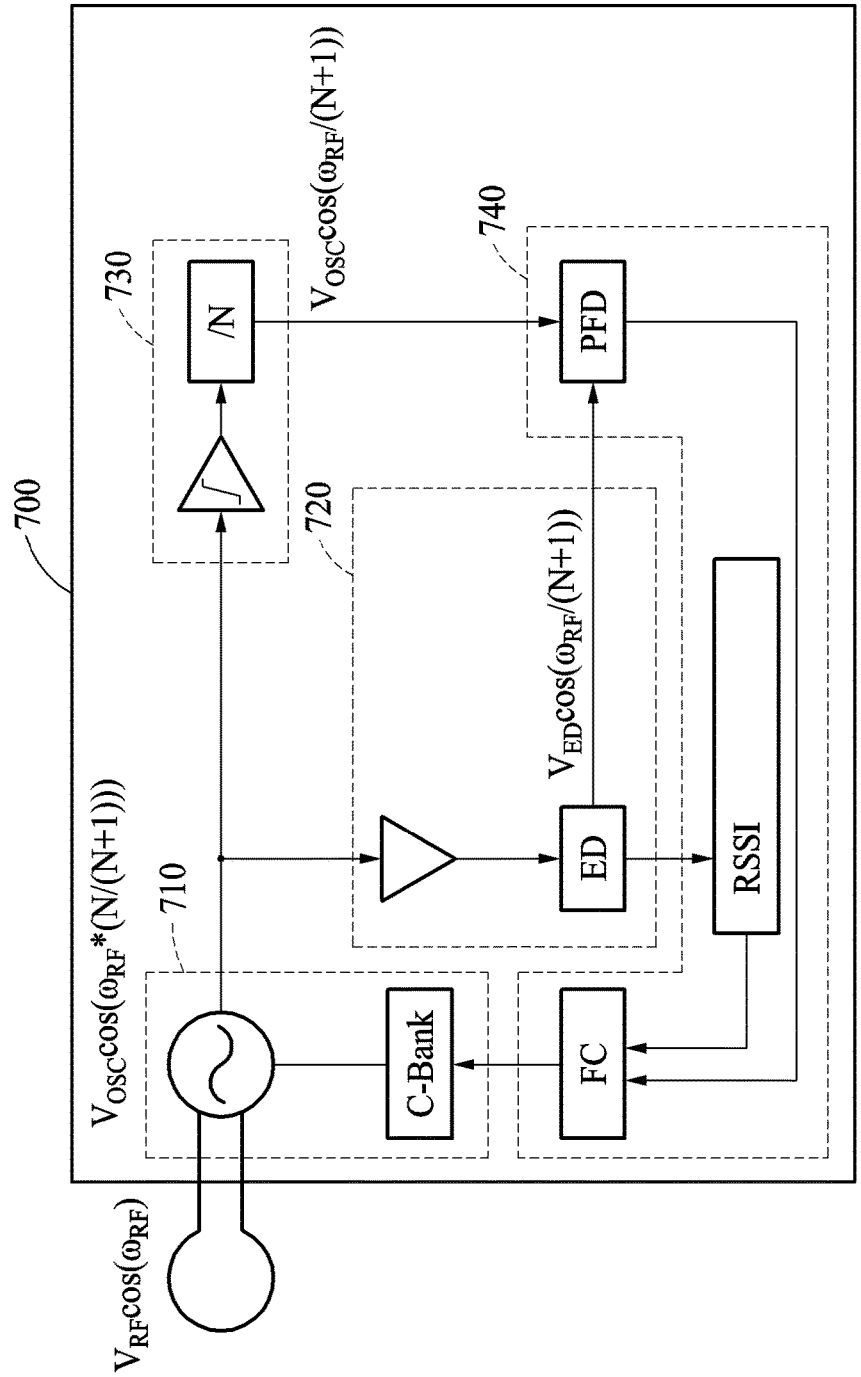
FIGS. 7 and 8 illustrate other examples of a configuration of a frequency calibrator.
Figure 8:
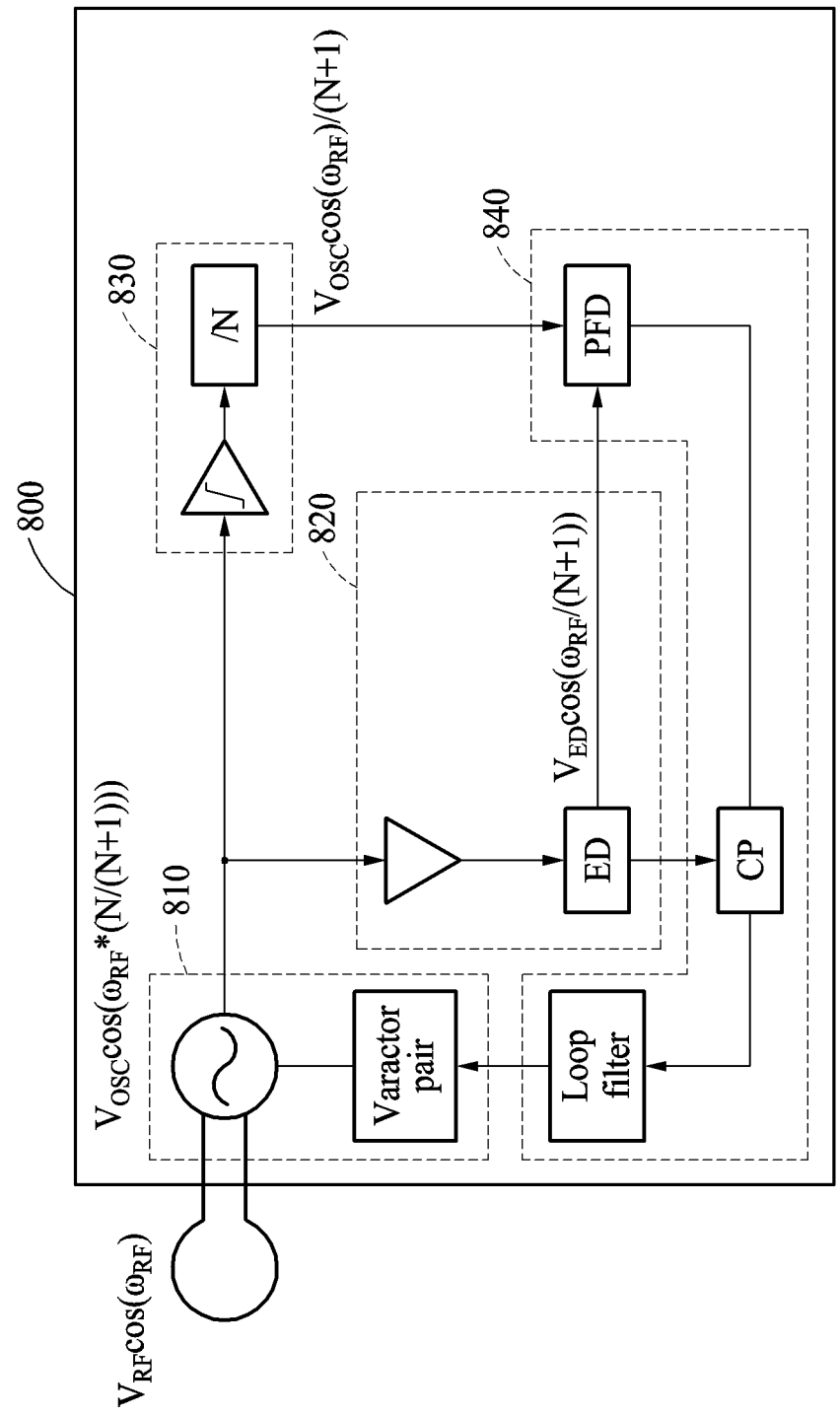

FIGS. 7 and 8 illustrate other examples of a configuration of a frequency calibrator.

FIG. 7 illustrates an example in which a frequency calibrator 700 includes a frequency tuner 740 configured as a digital device.

Referring to FIG. 7, the frequency calibrator 700 includes an input signal generator 710, a frequency difference extractor 720, a divider 730, and the frequency tuner 740.

The input signal generator 710 includes an antenna, an oscillator, and a capacitor bank (C-bank). The frequency difference extractor 720 includes a buffer and an envelope detector (ED). The divider 730 includes a limiting amplifier and an N divider (/N). The frequency tuner 740 includes a phase frequency detector (PFD), which is a frequency determiner, a signal strength detector that detects a received signal strength indicator (RSSI), and a frequency controller (FC).

The frequency calibrator 700 automatically calibrates an oscillation frequency in a chip based on an externally received external signal $V_{RF} \cos(\omega_{RF})$. An oscillation signal output from an oscillator after calibration is completed is $V_{OSC} \cos(\omega_{RF}*(N/(N+1)))$, an envelope signal is $V_{ED} \cos(\omega_{RF}/(N+1))$, and a division signal is $V_{OSC} \cos(\omega_{RF}/(N+1))$. Hereinafter, a frequency calibration process to equalize an envelope frequency of the envelope signal and a division frequency of the division signal will be described in detail.

The input signal generator 710 includes a coil-shaped antenna, hereinafter, a coil antenna, constituted by an inductor that is also an inductor of a voltage controlled oscillator (VCO). In response to an external frequency of the external signal $V_{RF} \cos(\omega_{RF})$ externally received through the antenna being close to an oscillation frequency of the oscillation signal $V_{OSC} \cos(\omega_{OSC})$ of the oscillator, the external frequency of the external signal and the oscillation frequency of the oscillation signal are mixed by the oscillator. An amplitude modulation (AM) signal in which the two signals are mixed is expressed by the following Equation 3.

$$V_{AM}(t)=A(1+m \cos \omega_m t)\cos \omega_{OSC} t \qquad (3)$$

In Equation 3, a modulation signal frequency $\omega_m$ in $A(1+m \cos \omega_m t)$ of the AM signal is $\omega_{RF}-\omega_{OSC}$, which corresponds to a frequency difference between the external signal and the oscillation signal. m denotes an AM ratio. The AM signal of Equation 3 is also referred to as the input signal.

As shown in FIG. 7, the input signal, which is an output of the oscillator, is input to the frequency difference extractor 720 and the divider 730. The input signal is separated into the envelope signal and an envelope-removed signal based on Equation 4 and Equation 5 below.

For example, an envelope is removed from the input signal output to the divider 730 by the limiting amplifier in the divider 730. The envelope-removed signal is expressed by the following Equation 4.

$$V_{LIMIT}(t) = A_1 \cos \omega_{OSC} t \quad (4)$$

Further, the envelope signal detected by the ED in the frequency difference extractor 720 is expressed by the following Equation 5.

$$V_{ENV}(t) = A_2 \cos \omega_m t = A_2 \cos(\omega_{RF} - \omega_{OSC}) t \quad (5)$$

In Equation 4, $V_{LIMIT}(t)$ denotes the signal obtained by removing the envelope signal from the input signal, which is a signal including a component corresponding to the oscillation frequency. In Equation 5, $V_{ENV}(t)$ denotes the envelope signal of the input signal.

A frequency of the envelope-removed signal $V_{LIMIT}(t)$ is divided by the N divider in the divider 730 by a factor of N. The signal obtained by dividing the oscillation frequency by the factor of N is referred to as a division signal, and the division signal is expressed by the following Equation 6.

$$V_{DIV}(t) = A_1 \cos\left(\frac{\omega_{OSC}}{N}\right) t \quad (6)$$

A frequency determiner compares the envelope signal expressed by Equation 5 to the division signal expressed by Equation 6. Herein, the frequency determiner is also referred to as a phase frequency detector (PFD).

For example, the PFD compares an envelope frequency of the envelope signal to a division frequency of the division signal. A comparison result output from the PFD is used as a control signal to control the oscillation frequency of the oscillator. The output of the PFD is output to a frequency controller (FC) that uses a frequency control algorithm to adjust a capacitance of a capacitor bank (C-Bank) based on the output of the PFD. The oscillation frequency of the oscillator is determined based on the capacitance of the C-Bank and an inductance of an inductor of the oscillator. In FIG. 7, the inductor of the coil antenna is also the inductor of the oscillator. In one example, the frequency controller FC is implemented as a binary searcher (BS) in which the frequency control algorithm includes a binary search algorithm. However, this is merely an example, and other frequency control algorithms may be used. The BS may be implemented by a processor, and outputs a digital control code that controls the C-Bank as follows.

Each capacitor included in the C-Bank has a capacitance corresponding to a respective bit of the digital control code output from the BS. In response to the C-bank including a total of K capacitors, the digital control code including a total of K bits, and an i-th bit of the digital control code being "1", an i-th capacitor in the C-Bank corresponding to the i-th bit of the digital control code is activated so that a capacitance of the C-Bank increases by a capacitance of the i-th capacitor. In response to a j-th bit of the digital control code being "0", a j-th capacitor in the C-Bank corresponding to the j-th bit of the digital control code is deactivated so that the capacitance of the C-Bank decreases by a capacitance of the j-th capacitor. K, i, and j are integers greater than or equal to "0", and i and j are integers less than or equal to K. As described above, the digital control code is digital information. The frequency calibrator 700 of FIG. 7 increases or decreases the capacitance of the oscillator in discrete steps based on the digital control code.

Finally, the frequency calibrator 700 increases or decreases the oscillation frequency so that a frequency relation between the oscillation frequency and the external frequency converges to the following Equation 7.

$$\omega_{RF} - \omega_{OSC} \approx \frac{\omega_{OSC}}{N} \quad (7)$$

The external frequency $\omega_{RF}$ satisfying Equation 7 is (N+1)/N times the oscillation frequency $\omega_{OSC}$. Thus, in response to a signal transmitter setting the external frequency $\omega_{RF}$ to be (N+1)/N times the oscillation frequency $\omega_{OSC}$ after the frequency calibrator 700 has completed frequency tuning, the oscillation frequency $\omega_{OSC}$ of the frequency calibrator 700 is automatically set to be N/(N+1) times the external frequency $\omega_{RF}$. For example, the frequency calibrator 700 including the divider 730 having a division ratio of "64" receives an external signal having an external frequency of 436.71875 MHz that is (64+1)/(64) times an oscillation frequency of 430 MHz to generate the oscillation frequency. The external signal is a signal input or injected by the signal transmitter.

Further, in order for the input signal generator 710 of the frequency calibrator 700 to generate the input signal in which the external signal and the oscillation signal are mixed, the external frequency needs to be set outside of a range in which frequency locking occurs with respect to the oscillation frequency. In a frequency range in which the external signal and the oscillation signal are mixed, the input signal output from the oscillator includes a component corresponding to a frequency difference $\omega_{RF}-\omega_{OSC}$. A predetermined frequency range in which the external frequency $\omega_{RF}$ and the oscillation frequency $\omega_{OSC}$ are mixed is expressed by the following Equation 8.

$$\omega_{RF} > \frac{\omega_{OSC} \cdot N \cdot I_{INJ}}{4Q\pi \cdot I_{OSC}} \quad (8)$$

In Equation 8, $I_{INJ}$ denotes a current of the external signal received by the frequency calibrator 700, and $I_{OSC}$ denotes a current of the signal output from the oscillator included in the frequency calibrator 700. Q denotes a Q-factor of a variable capacitor, for example, a C-Bank, and an inductor of an external antenna coil, and N denotes a division ratio.

Further, the signal strength detector detects a signal strength of the envelope signal, which is referred to as a received signal strength indicator (RSSI). In response to the signal strength of the envelope signal exceeding a threshold strength, the frequency calibrator 700 performs frequency calibration through the PFD. In another example, in response to the signal strength of the envelope signal exceeding the threshold strength, the frequency calibrator 700 continuously increases or continuously decreases the frequency. In response to the signal strength of the envelope signal being less than or equal to the threshold strength, the frequency calibrator 700 terminates the frequency calibration.

FIG. 8 illustrates another example in which a frequency calibrator 800 includes a frequency tuner 840 configured as an analog device.

Referring to FIG. 8, the frequency calibrator 800 includes an input signal generator 810, a frequency difference extractor 820, a divider 830, and the frequency tuner 840.

The input signal generator 810 includes an antenna, an oscillator, and a varactor pair. The frequency difference extractor 820 includes a buffer and an envelope detector (ED). The divider 830 includes a limiting amplifier and an N divider (/N). The frequency tuner 840 includes a phase frequency detector (PFD), which is a frequency determiner, a charge pump (CP), and a loop filter.

The input signal generator 810, the frequency difference extractor 820, the divider 830, and the frequency tuner 840 of the frequency calibrator 800 of FIG. 8 operate similarly to the input signal generator 710, the frequency difference extractor 720, the divider 730, and the frequency tuner 740 of the frequency calibrator 700 of FIG. 7. The frequency calibrator 800 of FIG. 8 tunes an oscillation frequency of an oscillator to finally satisfy Equation 7. The finally tuned oscillation frequency, the division frequency, and the envelope frequency are the same as those of FIG. 7.

However, unlike the example of FIG. 7 in which the frequency of the oscillator is controlled in a digital manner, FIG. 8 illustrates an example in which the frequency of the oscillator is controlled in an analog manner. For example, the frequency tuner 840 continuously adjusts a capacitance of the oscillator using the charge pump (CP) and the loop filter (LF). The input signal generator 810 includes the varactor pair, and a capacitance of the varactor pair is changed continuously by the LF. However, this is merely one example, and the oscillator may include another type of variable capacitor instead of the varactor pair.

Figure 9:
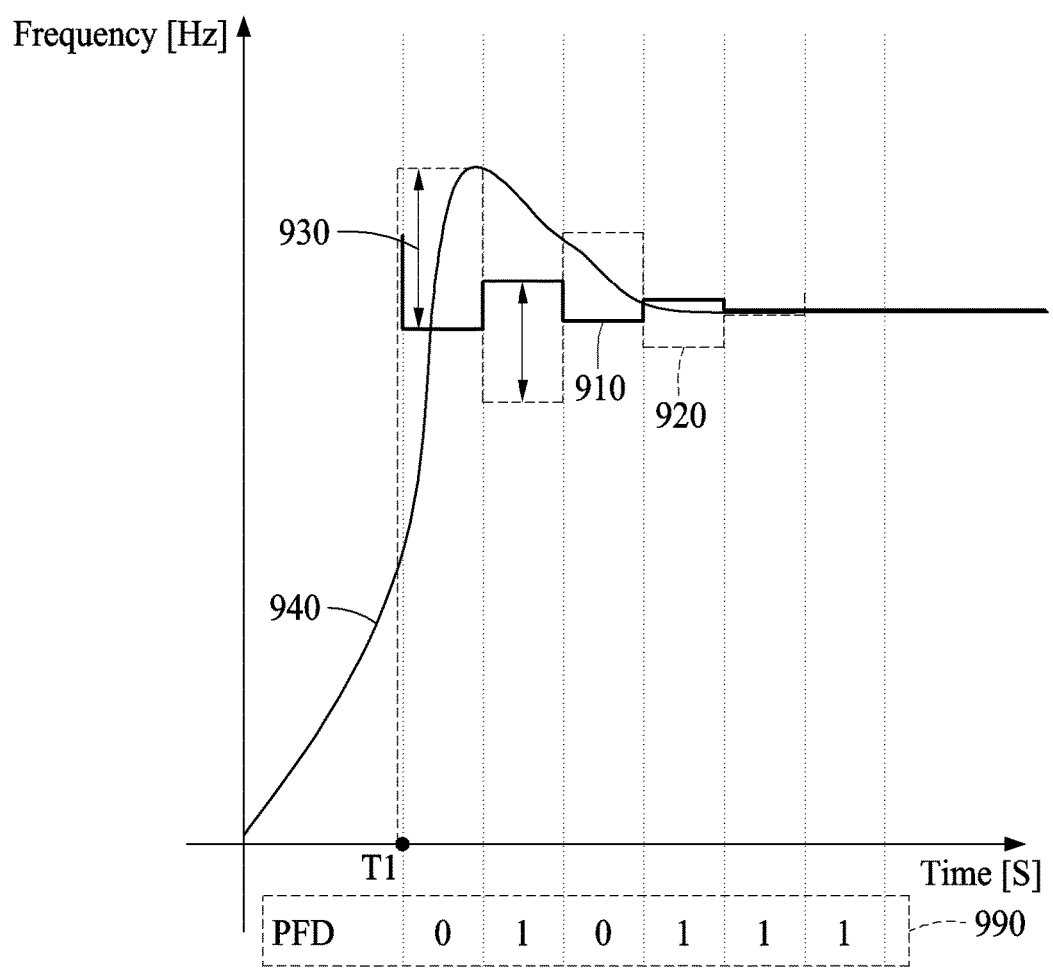
FIG. 9 illustrates an example of changes in an oscillation frequency and a frequency difference signal in response to frequency tuning of a frequency calibrator.

FIG. 9 illustrates an example of changes in an oscillation frequency and a frequency difference signal in response to frequency tuning of a frequency calibrator.

In a graph of FIG. 9, a y axis indicates frequencies of a frequency difference signal 920 and a division signal 910 in Hz. An x axis indicates a time in seconds.

Further, below the x axis are illustrated examples of an output 990 of a PFD. For each period, the PFD outputs "1" in response to a division frequency of a signal obtained by dividing the oscillation frequency being greater than or equal to the external frequency, or outputs "0" in response to the division frequency being less than the external frequency. However, this is merely one example. In other examples, "0" and "1" may be output reversely according to the design, or information other than the binary numbers of "0" and "1" may be output.

A frequency tuner compares the frequency of the frequency difference signal 920 to the frequency of the division signal 910, and changes a capacitance of the oscillator based on a frequency difference 930 between the frequency difference signal 920 and the division signal 910.

For example, the frequency tuner decreases the capacitance of the oscillator in response to the frequency of the division signal 910 being less than the frequency of the frequency difference signal 920, for example, $$\omega_{OSC} < \omega_{RF} \cdot \left(\frac{N}{N+1}\right).$$

The frequency tuner increases the capacitance of the oscillator in response to the frequency of the division signal 910 being greater than the frequency of the frequency difference signal 920, for example, $$\omega_{OSC} > \omega_{RF} \cdot \left(\frac{N}{N+1}\right).$$

The frequency tuner determines that the frequency tuning is completed in response to the frequency of the division signal 910 being the same as the frequency of the frequency difference signal 920, or a difference therebetween being less than or equal to a predetermined frequency value. Thus, the oscillation frequency of the oscillation signal is tuned to a frequency that is N/(N+1) times the external frequency.

The capacitance of the oscillator is adjusted based on a binary search. For example, in response to the frequency of the division signal 910 being less than the frequency of the frequency difference signal 920 at a predetermined timing, the frequency tuner decreases the capacitance of the capacitor to an intermediate value in a range less than or equal to a capacitance set for the corresponding timing. In response to the frequency of the division signal 910 being greater than the frequency of the frequency difference signal 920 at a predetermined timing, the frequency tuner increases the capacitance of the capacitor to an intermediate value in a range greater than or equal to a capacitance set for the corresponding timing.

In the timing diagram of FIG. 9, the frequency difference signal 920 and the division signal 910 are respectively output from the frequency difference extractor 720 and the divider 730 of FIG. 7. The frequency difference 930 between the frequency difference signal 920 and the division signal 910 decreases in phases and converges to "0".

Further, an analog division signal 940 is a signal obtained by dividing the oscillation frequency of the oscillator controlled by the varactor pair of FIG. 8. A frequency of the division signal output from the divider 830 of FIG. 8 is gradually tuned to be the same as the frequency of the frequency difference signal as shown in FIG. 9. The analog division signal 940 is illustrated along with the other signals 910, 920, and 930 of FIG. 9. for ease of illustration.

The frequency calibrator causes $$\Delta\omega_1 = \frac{\omega_{OSC1}}{N} - (\omega_{RF} - \omega_{OSC1})$$

corresponding to the frequency difference 930 between the initial division signal and the frequency difference signal to converge to "0". When frequency tuning is completed, $$\frac{\omega_{OSC}}{N} = (\omega_{RF} - \omega_{OSC})$$

is satisfied.

The frequency calibrator accurately tracks the external frequency of the external signal without using an additional reference frequency generator, for example, a crystal. For example, a final frequency error of the frequency calibrator after completing the frequency tuning based on a binary search is expressed by the following Equation 9.

$$\text{Frequency error} = \omega_{RF} \cdot \frac{N}{N+1} - \omega_{OSC} \qquad (9)$$

In Equation 9, $\omega_{RF}$ denotes the external frequency of the external signal received by the frequency calibrator, $\omega_{OSC}$ denotes the oscillation frequency of the oscillator, and N denotes a division ratio of the divider, N being a real number greater than "0". For example, the frequency error of the frequency calibrator is about 100 kHz.

Figure 10:
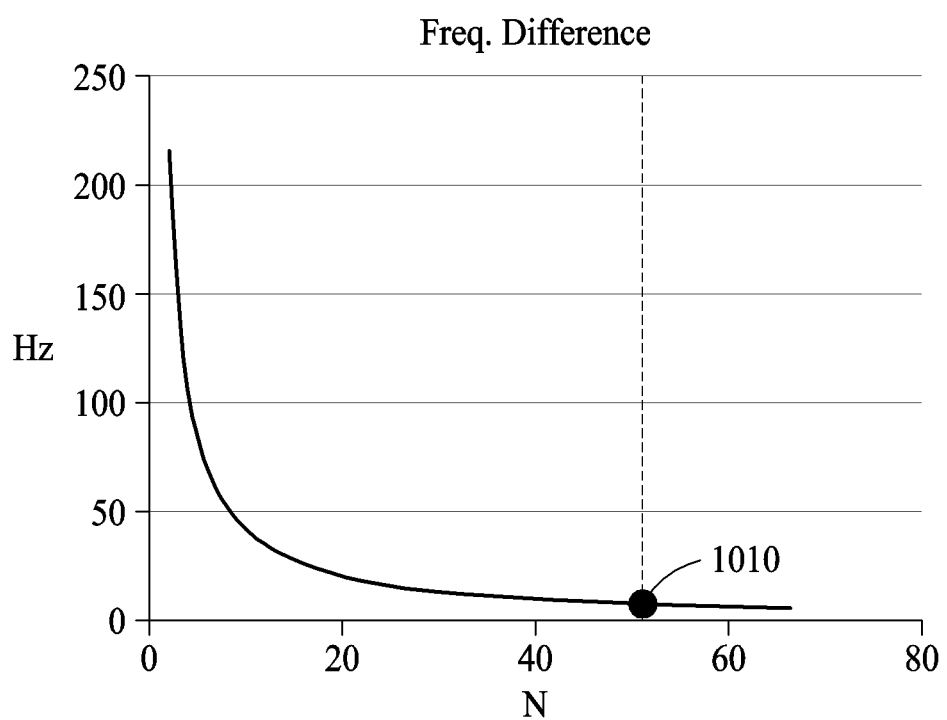
FIG. 10 illustrates an example of a division ratio used by a frequency calibrator.

FIG. 10 illustrates an example of a division ratio used by a frequency calibrator.

In the graph in FIG. 10, a y axis indicates a frequency of a frequency difference signal $f_{RF}$-$f_{OSC}$ in Hz. An x axis indicates a division ratio N of a divider. As shown in FIG. 10, the division ratio N of the divider is set to be a value less than a threshold division ratio 1010 according to the following Equation 10.

$$N < \frac{\omega_{OSC} \cdot I_{INJ}}{4Q\pi \cdot I_{OSC}} \qquad (10)$$

For example, the division ratio N is set to be a value less than the threshold division ratio 1010 (on the right term of Equation 10), which is determined based on an oscillation frequency $\omega_{OSC}$, an injection current $I_{INJ}$ of the external signal, a Q-factor Q of a variable capacitor, for example, a C-Bank, and an inductor of an external antenna coil, and an oscillation current $I_{OSC}$ of an oscillator as expressed by Equation 10.

Figure 11:
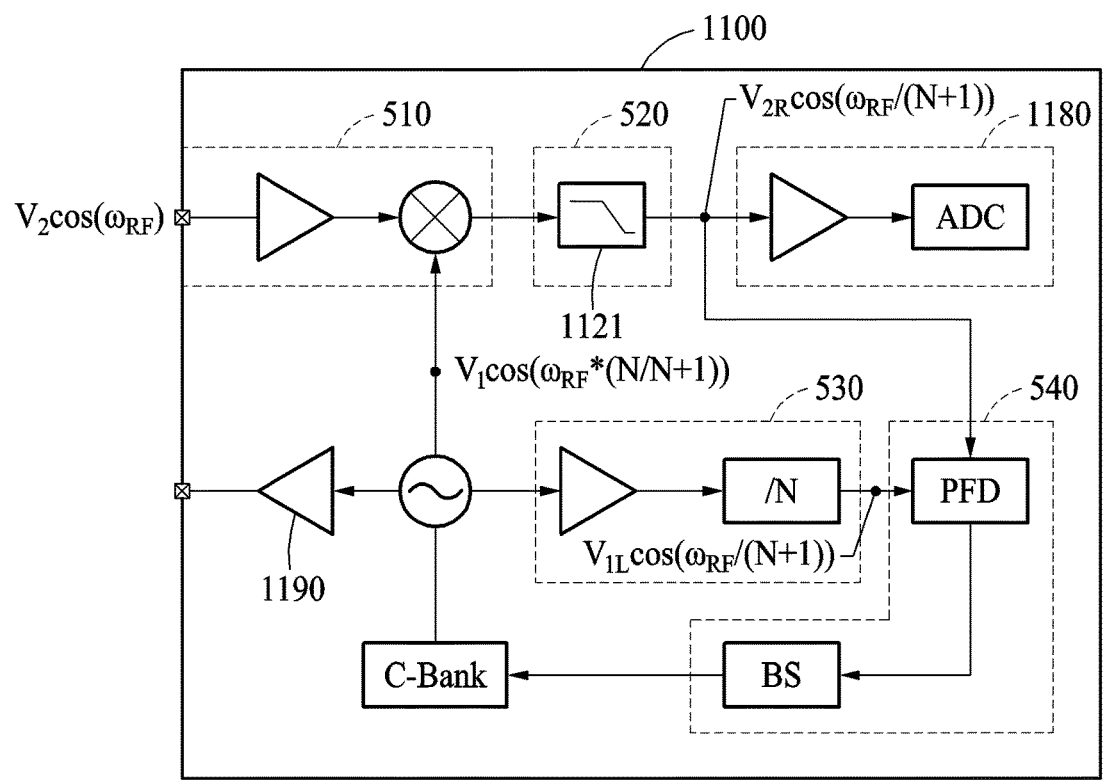
FIGS. 11 and 12 illustrate other examples of a configuration of a frequency calibrator.
Figure 12:
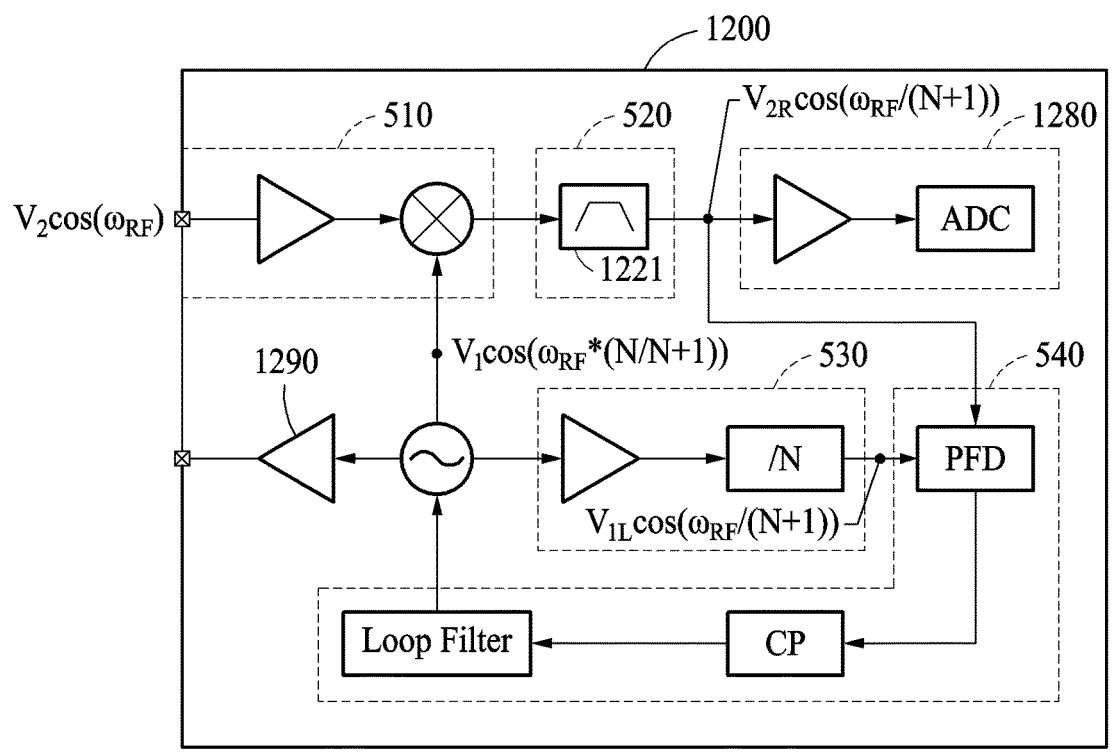

FIGS. 11 and 12 illustrate other examples of a configuration of a frequency calibrator.

FIGS. 11 and 12 illustrate frequency calibrators 1100 and 1200 that are implemented in a structure of a transceiver in which a data receiving path is separated from a signal path of an oscillator. For example, the frequency calibrators 1100 and 1200 are implemented in a structure of a transceiver that operates at a low intermediate frequency (IF). Further, in the frequency calibrators 1100 and 1200 of FIGS. 11 and 12, a signal $V_{2R} \cos(\omega_{RF}/(N+1))$ at an output node of the frequency difference extractor 520 and a signal $V_{1L} \cos(\omega_{RF}/(N+1))$ at an output node of the divider 530 are frequency-tuned signals. A tuned oscillation frequency $\omega_{OSC}$ is expressed by $\omega_{OSC}=N/(N+1)*\omega_{RF}$. A time variable t has been omitted from the expressions in FIGS. 11 and 12. $V_{2R}$ denotes a voltage amplitude of the frequency difference signal, $V_1$ denotes a voltage amplitude of the oscillation signal, and $V_{1L}$ denotes a voltage amplitude of the division signal.

Referring to FIG. 11, the frequency calibrator 1100 includes an input signal generator 510, a frequency difference extractor 520, a divider 530, a frequency tuner 540, an oscillator, a capacitor bank (C-Bank), a data extractor 1180, and a buffer 1190.

The input signal generator 510 includes a buffer and a frequency mixer configured to receive the oscillation signal from the oscillator, receive the external signal from an external device, and generate an input signal by mixing the oscillation signal and the external signal. Unlike the frequency calibrators 700 and 800 of FIGS. 7 and 8, the oscillator in the frequency calibrator 1100 of FIG. 11 outputs only the oscillation signal having the oscillation frequency.

Further, the frequency difference extractor 520 includes a pass filter 1121 configured to pass a signal within a threshold frequency bandwidth in a mix signal. The pass filter 1121 extracts only a frequency difference component from the mix signal. In the structure of FIG. 11, the pass filter 1121 is a low-pass filter (LPF).

Further, the divider 530 includes a buffer and an N divider (/N) that divides the oscillation signal from the oscillator by N to obtain a division signal.

Similarly to the structure of FIG. 7, the frequency tuner 540 of FIG. 11 includes a phase frequency detector (PFD) that compares a frequency of the envelope signal from the frequency difference extractor 520 with a frequency of the divisional signal from the divider 530, and a binary searcher (BS) that calibrates the oscillation frequency by changing a capacitance of the capacitor bank (C-Bank) in discrete steps based on a binary search and the result of the comparing from the phase frequency detector (PFD). The binary searcher (BS) may be implemented by a processor.

In addition, the data extractor 1180 of the frequency calibrator 1100 extracts data from the input signal through a buffer and an analog-to-digital converter (ADC). Furthermore, the frequency calibrator 1100 transmits a signal to an external device through the buffer 1190 using the oscillation frequency of the oscillator. The oscillation frequency used for transmission is a frequency compensated by the frequency calibrator 1100.

Referring to FIG. 12, the frequency calibrator 1200 includes an input signal generator 510, a frequency difference extractor 520, a divider 530, a frequency tuner 540, an oscillator, a data extractor 1280, and a buffer 1290.

The input signal generator 510 includes a buffer and a frequency mixer. The frequency difference extractor 520 includes a band-pass filter 1221. The divider 530 includes a buffer and an N divider (/N). The frequency tuner 540 includes a phase frequency detector (PFD), which is a frequency determiner, a charge pump (CP), and a loop filter. The data extractor 1280 includes a buffer and an analog-to-digital converter (ADC).

The divider 530 and the frequency tuner 540 in the frequency calibrator 1200 operate in the same manner as the divider 830 and the frequency tuner 840 of FIG. 8. The input signal generator 510, the data extractor 1280, and the buffer 1290 of FIG. 12 operate in the same manner as the input signal generator 510, the data extractor 1180, and the buffer 1190 of FIG. 11. Accordingly, descriptions of these elements will not be repeated here.

The frequency difference extractor 520 includes the band-pass filter (BPF) 1221. The BPF 1221 is a filter configured to pass a frequency in a band within a predetermined range.

The frequency tuner 540 of FIG. 12 continuously tunes the oscillation frequency, rather than in discrete steps, similarly to the structure of FIG. 8.

Figure 13:
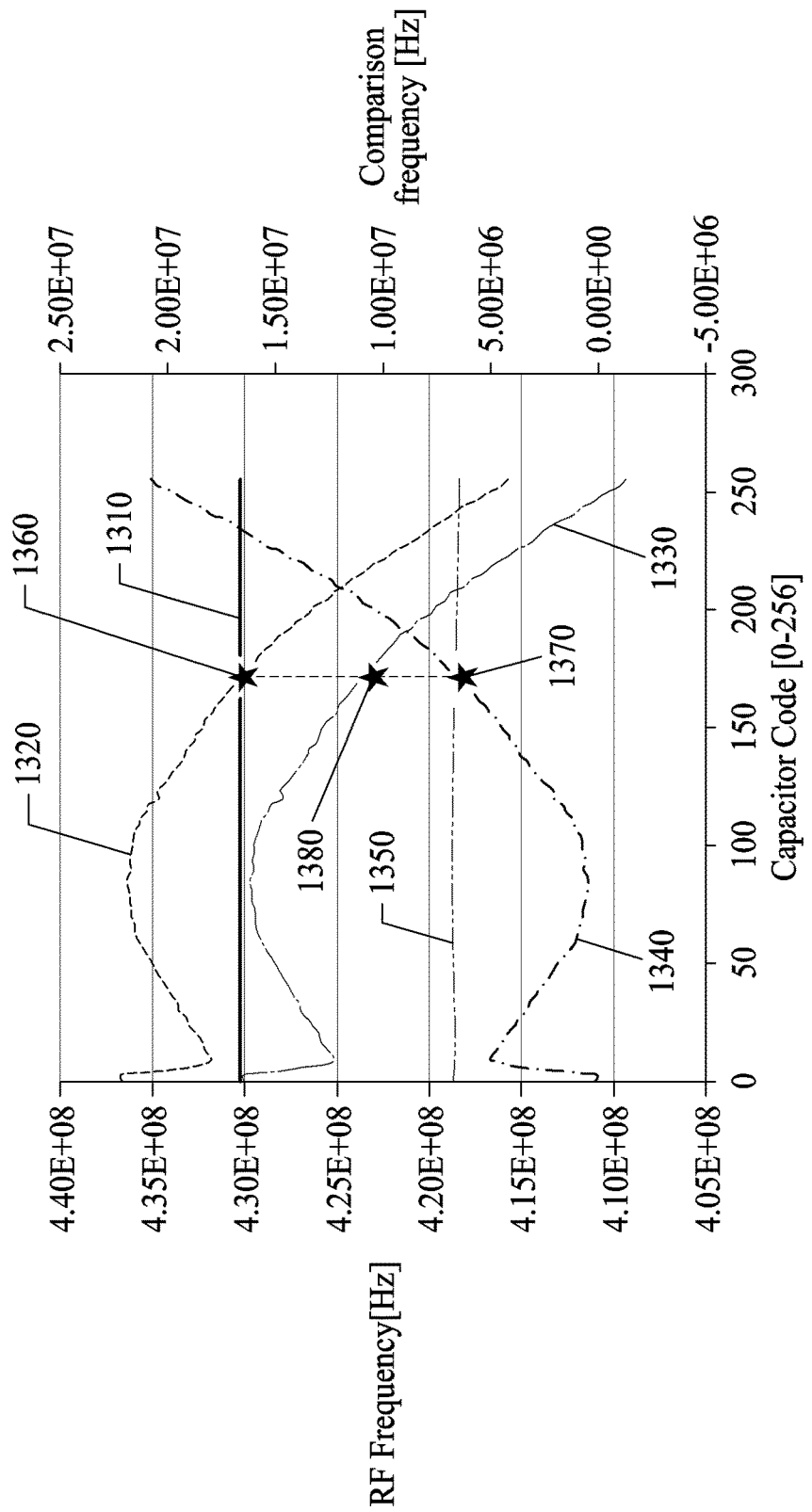
FIG. 13 illustrates an example of relationships of an external signal, an oscillation frequency, and a frequency difference signal with respect to a capacitance of an oscillator in a frequency calibrator.

FIG. 13 illustrates an example of relationships of an external signal, an oscillation frequency, and a frequency difference signal with respect to a capacitance of an oscillator in a frequency calibrator.

In the graph in FIG. 13, a left y axis indicates a frequency of an external signal 1310, a frequency of an oscillation signal 1330, and a frequency of a signal 1320 that is (N+1)/N times the frequency of the oscillation signal 1330, with respect to a capacitor code, in Hz. A right y axis indicates a frequency of a division signal 1350 and a frequency of a frequency difference signal 1340, with respect to the capacitor code, in Hz. The left y axis and the right y axis have different scales. An x axis indicates the capacitor code. The capacitor code is a digital control signal, and is also referred to as a digital control code. The capacitor code of FIG. 13 has a total of 256 bits.

The frequency calibrator controls the capacitor code to equalize the division frequency $f_{OSC}/N$ of the division signal 1350 and the frequency $f_{RF}-f_{OSC}$ of the frequency difference signal 1340. A first point 1370 at which the division frequency $f_{OSC}/N$ of the division signal 1350 and the frequency $f_{RF}-f_{OSC}$ of the frequency difference signal 1340 are equalized is as shown in FIG. 13.

Frequency calibration performed based on the division signal 1350 and the frequency difference signal 1340 is interpreted at the scales of the external signal 1310 and the oscillation signal 1330 as follows. For example, at a capacitor code of the first point 1370, a second point 1360 at which the external frequency $f_{RF}$ of the external signal 1310 and the frequency of the signal 1320 that is (N+1)/N times the oscillation frequency $f_{OSC}$ of the oscillation signal 1330 are equalized, for example, $f_{RF}=(N+1)/N_{OSC}$, appears. Thus, the oscillation frequency $f_{OSC}$ of the oscillation signal 1330 is set to a frequency 1380 that is N/(N+1) times the external frequency $f_{RF}$ of the external signal 1310.

FIGS. 14, 15, 16A, and 16B illustrate examples of a frequency calibration method.

Figure 14:
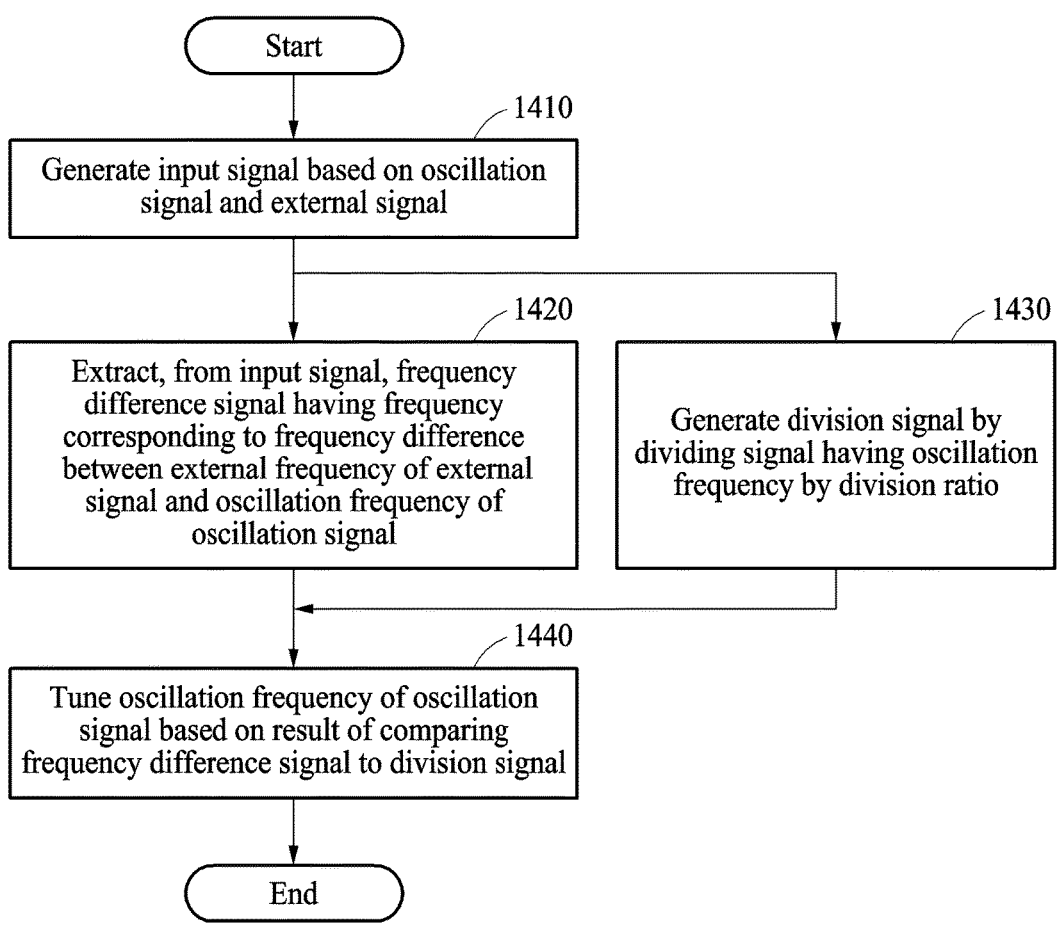
FIGS. 14, 15, 16A, and 16B illustrate examples of a frequency calibration method.

FIG. 14 is a flowchart illustrating an example of a frequency calibration method.

In operation 1410, an input signal generator of a frequency calibrator generates an input signal based on an oscillation signal and an external signal. As described above, the input signal is a signal generated by mixing the oscillation signal and the external signal, and includes a component corresponding to the oscillation frequency and a frequency difference component between the external frequency and the oscillation frequency.

In operation 1420, a frequency difference extractor of the frequency calibrator extracts, from the input signal, a frequency difference signal having a frequency corresponding to a frequency difference between an external frequency of the external signal and an oscillation frequency of the oscillation signal.

In operation 1430, the frequency calibrator generates a division signal by dividing a signal having the oscillation frequency by a division ratio. For example, the frequency calibrator generates the division signal by dividing the frequency of the signal having the oscillation frequency using a frequency divider, for example, a divider. In the structures of FIGS. 7 and 8, the signal having the oscillation frequency is the signal generated by removing the envelope signal from the input signal. In the structures of FIGS. 11 and 12, the signal having the oscillation frequency is the oscillation signal output from the oscillator.

Operations 1420 and 1430 are performed in parallel, and thus the frequency calibrator performs operations 1420 and 1430 simultaneously.

In operation 1440, a frequency tuner of the frequency calibrator tunes the oscillation frequency of the oscillation signal based on a result of comparing the frequency difference signal to the division signal. For example, as described above, the frequency tuner tunes the oscillation frequency of the oscillation signal by adjusting a capacitance of the oscillator in discrete steps or continuously.

However, the frequency calibration method is not limited to FIG. 14. The frequency calibration method may be performed in combination with detailed operations of the frequency calibrators illustrated in FIGS. 5, 6A, 6B, 7, 8, 11, and 12.

Figure 15:
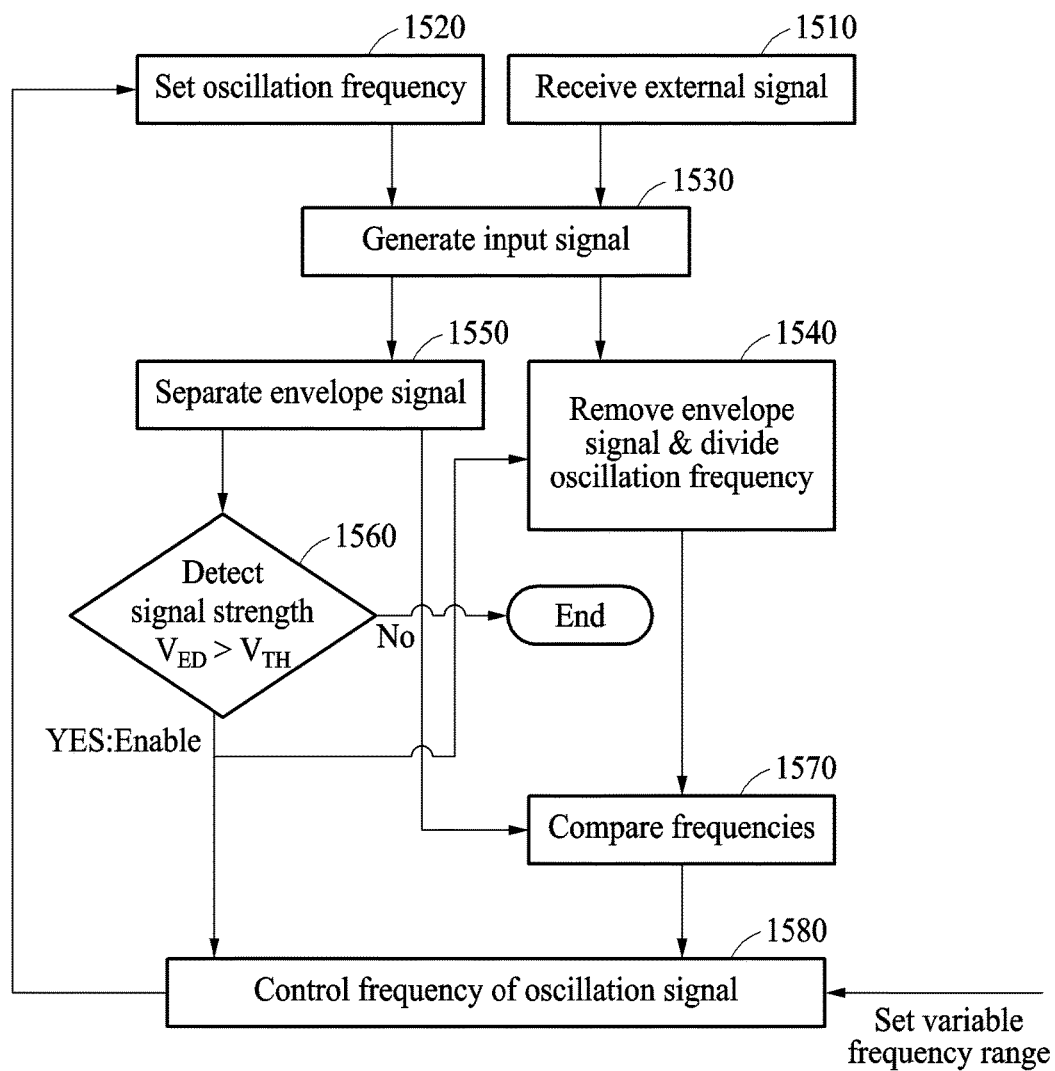

FIG. 15 is a flowchart illustrating another example of a frequency calibration method.

In operation 1510, a frequency calibrator receives an external signal. In operation 1520, the frequency calibrator sets an oscillation frequency. In operation 1530, the frequency calibrator generates an input signal having a frequency in which the oscillation frequency and an external frequency are mixed. In operation 1540, the frequency calibrator extracts a signal having the oscillation frequency by removing an envelope signal, and divides the oscillation frequency. In operation 1550, the frequency calibrator separates the envelope signal from the input signal.

In operation 1560, the frequency calibrator detects a signal strength $V_{ED}$ of the envelope signal, and compares the signal strength $V_{ED}$ to a threshold strength $V_{TH}$. In response to the signal strength $V_{ED}$ of the envelope signal exceeding the threshold strength $V_{TH}$, the frequency calibrator continues dividing the oscillation frequency in operation 1540, and controls the frequency of the oscillation signal in operation 1580. In response to the signal strength $V_{ED}$ being less than or equal to the threshold strength $V_{TH}$, the frequency calibrator terminates the frequency calibration.

In operation 1570, the frequency calibrator compares an envelope frequency of the separated envelope signal to a division frequency of a division signal obtained by dividing the oscillation frequency. In operation 1580, the frequency calibrator controls the frequency of the oscillation signal based on a result of comparing the envelope signal to the division signal. The frequency calibrator sets a variable frequency range with respect to the oscillation frequency of the oscillation signal. The variable frequency range is determined based on a total capacitance of an oscillator. In operation 1520, the frequency calibrator sets the tuned oscillation frequency with respect to the oscillator. The frequency calibrator iterates the above process until an envelope signal is not detected or until the envelope frequency and the division frequency are equalized.

Figure 16A:
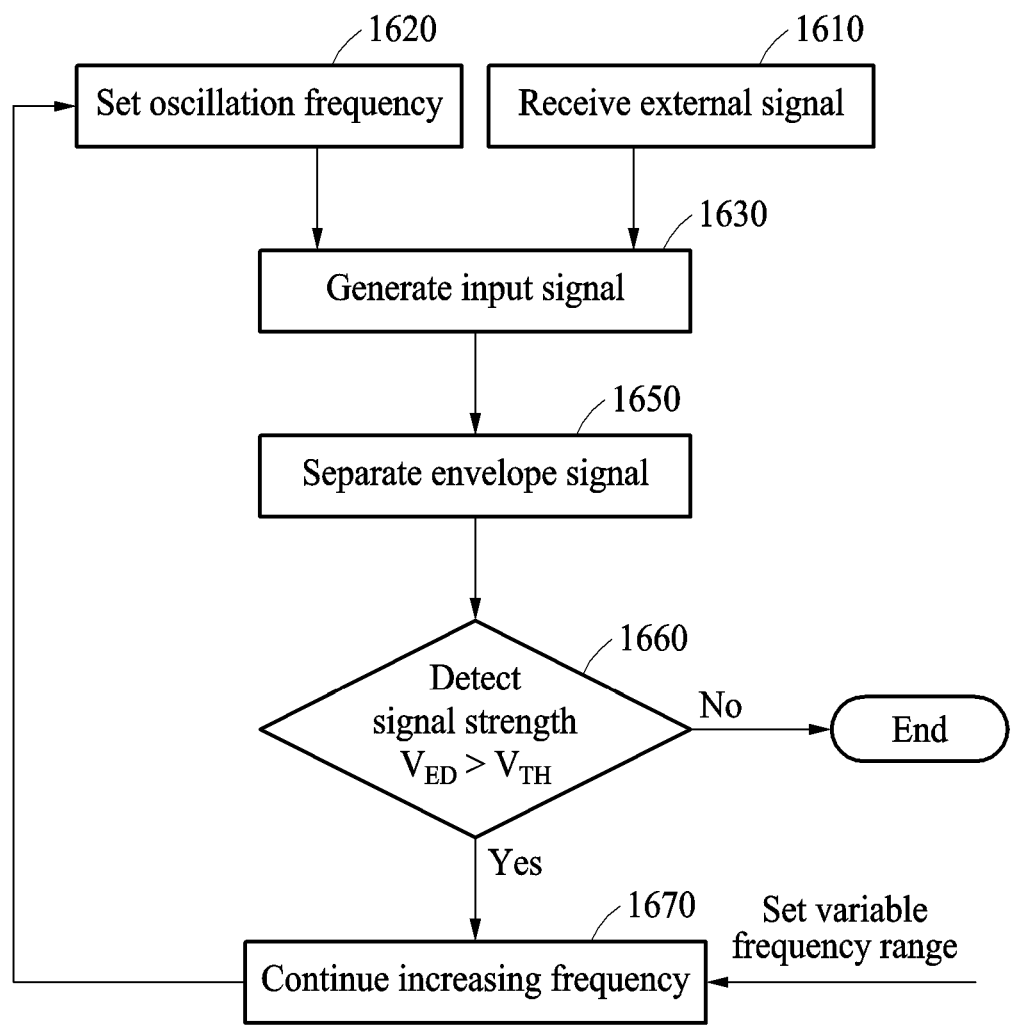
Figure 16B:
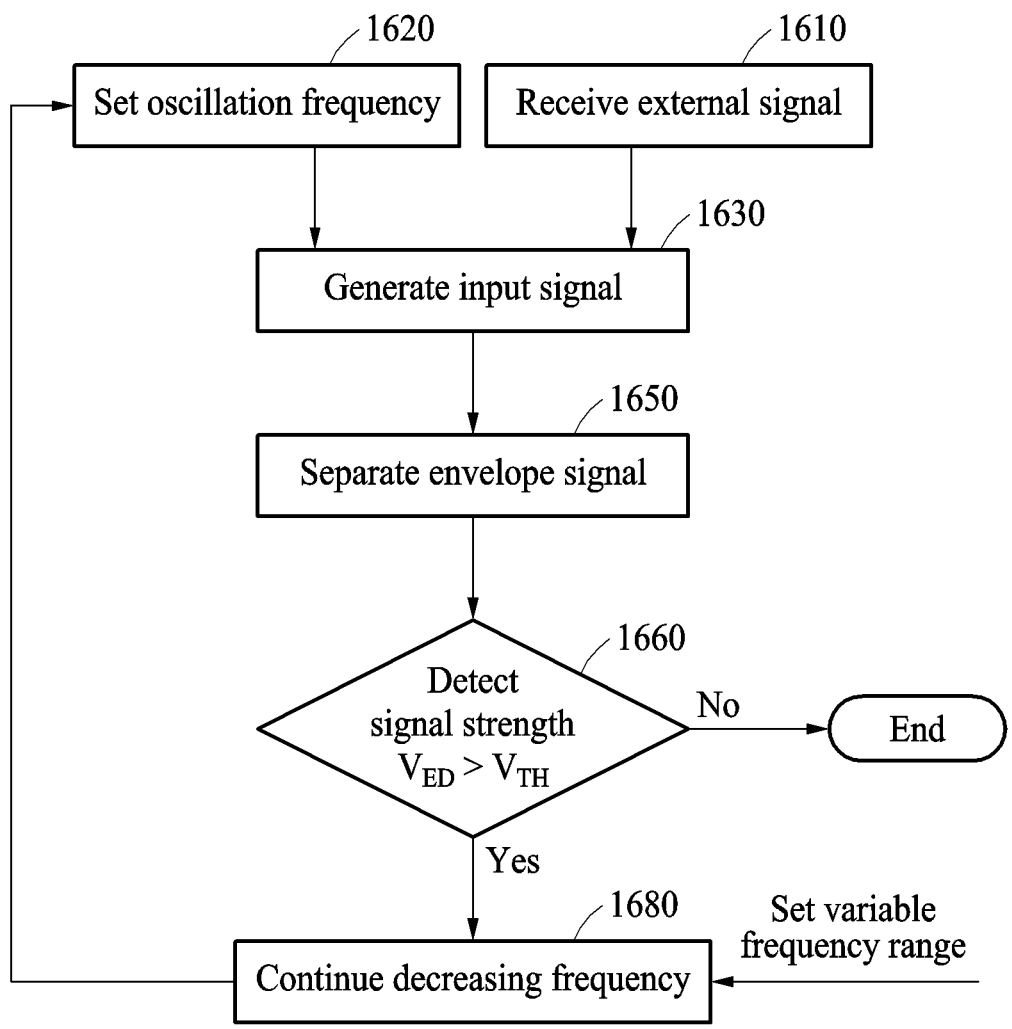

FIGS. 16A and 16B are flowcharts illustrating other examples of a frequency calibration method using only a signal strength of an envelope signal. For example, a frequency calibrator increases or decreases a frequency in direct response to the signal strength of the envelope signal.

Referring to FIGS. 16A and 16B, in operation 1610, the frequency calibrator receives an external signal. In operation 1620, the frequency calibrator sets an oscillation frequency. In operation 1630, the frequency calibrator generates an input signal having a frequency in which the oscillation frequency and an external frequency are mixed. In operation 1650, the frequency calibrator separates an envelope signal from the input signal. In operation 1660, the frequency calibrator detects a signal strength $V_{ED}$ of the envelope signal, and compares the signal strength $V_{ED}$ to a threshold strength $V_{TH}$.

In response to the signal strength $V_{ED}$ of the frequency difference signal exceeding the threshold strength $V_{TH}$, the frequency calibrator changes the oscillation frequency of the oscillator in one direction. In response to the signal strength $V_{ED}$ being less than or equal to the threshold strength $V_{TH}$, the frequency calibrator terminates changing the oscillation frequency. The one direction may be an incremental direction of the oscillation frequency, that is, a direction in which the oscillation frequency increases, or a decremental direction of the oscillation frequency, that is, a direction in which the oscillation frequency decreases.

In FIG. 16A, in response to the signal strength $V_{ED}$ of the envelope signal exceeding the threshold strength $V_{TH}$, the frequency calibrator continuously increases the frequency of the oscillator in operation 1670. For example, when setting a variable frequency range, the frequency calibrator sets the oscillation frequency of the oscillator to a minimum frequency, and unilaterally continues increasing the oscillation frequency while the signal strength $V_{ED}$ exceeds the threshold strength $V_{TH}$. In response to the signal strength $V_{ED}$ being less than or equal to the threshold strength $V_{TH}$, the frequency calibrator terminates increasing the frequency.

In FIG. 16B, in response to the signal strength $V_{ED}$ of the envelope signal exceeding the threshold strength $V_{TH}$, the frequency calibrator continuously decreases the frequency of the oscillator in operation 1680. For example, when setting a variable frequency range, the frequency calibrator sets the oscillation frequency of the oscillator to a maximum frequency, and unilaterally continues decreasing the oscillation frequency while the signal strength $V_{ED}$ exceeds the threshold strength $V_{TH}$. In response to the signal strength $V_{ED}$ being less than or equal to the threshold strength $V_{TH}$, the frequency calibrator terminates decreasing the frequency.

Figure 17:
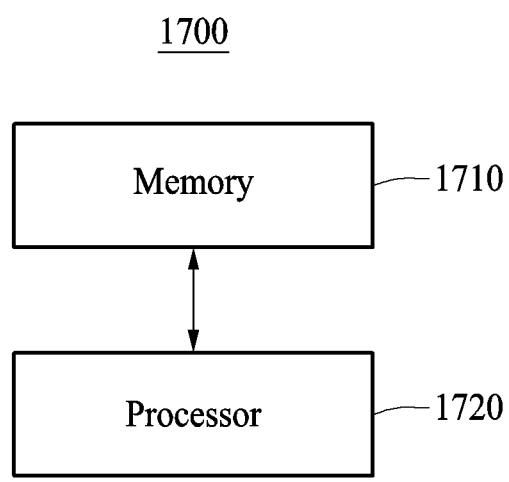
FIG. 17 illustrates an example of a block diagram of a controller that may be used to implement one or more of the hardware components illustrated in FIGS. 5, 6A, 6B, 7, 8, 11, and 12, and perform one or more of the operations illustrated in FIGS. 14, 15, 16A, and 16B.

FIG. 17 illustrates an example of a block diagram of a controller that may be used to implement one or more of the hardware components illustrated in FIGS. 5, 6A, 6B, 7, 8, 11, and 12, and perform one or more of the operations illustrated in FIGS. 14, 15, 16A, and 16B.

Referring to FIG. 17, a controller 1700 includes a memory 1710 and a processor 1720. The memory 1710 stores instructions that, when executed by the processor 1720, cause the processor 1720 to implement one or more of the hardware components illustrated in FIGS. 5, 6A, 6B, 7, 8, 11, and 12, or perform one or more of the operations illustrated in FIGS. 14, 15, 16A, and 16B. The descriptions of FIGS. 1-16B are also applicable to FIG. 17, and thus will not be repeated here.

The frequency calibration system 100, the frequency calibrator 110, and the signal transmitter 190 in FIG. 1, the frequency calibrator 500, the input signal generator 510, the frequency difference extractor 520, the divider 530, and the frequency tuner 540 in FIG. 5, the frequency calibrator 600, the input signal generator 510, the antenna 611, the oscillator 612, the frequency difference extractor 520, the envelope detector (ED) 621, the divider 530, the limiting amplifier 631, the N divider 632, the frequency tuner 540, the frequency determiner 641, the binary searcher (BS) 642, the signal strength detector 643, and the frequency controller 644 in FIG. 6A, the frequency calibrator 600', the input signal generator 510, the antenna 611, the oscillator 612, the frequency difference extractor 520, the envelope detector (ED) 621, the frequency tuner 540, the signal strength detector 643, and the frequency controller 644 in FIG. 6B, the frequency calibrator 700, the input signal generator 710, the antenna, the oscillator, the C-bank, the frequency difference extractor 720, the buffer, the envelope detector (ED), the divider 730, the limiting amplifier, the N divider (/N), the frequency tuner 740, the phase frequency detector (PFD), the signal strength detector that detects the received signal strength indicator (RSSI), and the frequency controller (FC) in FIG. 7, the frequency calibrator 800, the input signal generator 810, the antenna, the oscillator, the varactor pair, the frequency difference extractor 820, the buffer, the envelope detector (ED), the divider 830, the limiting amplifier, the N divider (/N), the frequency tuner 840, the phase frequency detector (PFD), the charge pump (CP), and the loop filter in FIG. 8, the frequency calibrator 1100, the input signal generator 510, the buffer, the frequency mixer, the frequency difference extractor 520, the low-pass filter 1121, the divider 530, the buffer, the N divider (/N), the frequency tuner 540, the phase frequency detector (PFD), the binary searcher (BS), the C-bank, the oscillator, the data extractor 1180, the buffer, the analog-to-digital converter (ADC), and the buffer 1190 in FIG. 11, and the frequency calibrator 1200, the input signal generator 510, the buffer, the frequency mixer, the frequency difference extractor 520, the band-pass filter 1221, the divider 530, the buffer, the N divider (/N), the frequency tuner 540, the phase frequency detector (PFD), the charge pump (CP), the loop filter, the oscillator, the data extractor 1280, the buffer, the analog-to-digital converter (ADC), and the buffer 1290 in FIG. 12 that perform the operations described in this application are implemented by hardware components configured to perform the operations described in this application that are performed by the hardware components. Examples of hardware components that may be used to perform the operations described in this application where appropriate include oscillators, frequency mixers, filters, amplifiers, envelope detectors, phase frequency detectors, inductors, capacitors, controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. For example, at least the frequency tuner 540 in FIG. 5, the frequency determiner 641, the binary searcher (BS) 642, and the frequency controller 644 in FIG. 6A, the frequency controller 644 in FIG. 6B, the phase frequency detector (PFD), the signal strength detector that detects the received signal strength indicator (RSSI), and the frequency controller (FC) in FIG. 7, the phase frequency detector (PFD) in FIG. 8, the phase frequency detector (PFD) and the binary searcher (BS) in FIG. 11, and the phase frequency detector (PFD) in FIG. 12 may be implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 14, 15, 16A, and 16B that perform the operations described in this application are performed by hardware components configured to perform the operations described in this application that are performed by the hardware components as described above. In other examples, one or more of the hardware components that perform the operations described in this application are implemented by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A frequency calibrator comprising:
    an input signal generator configured to generate an input signal based on an oscillation signal and an external signal;
    a frequency difference extractor configured to extract, from the input signal, a frequency difference signal having a frequency corresponding to a frequency difference between an external frequency of the external signal and an oscillation frequency of the oscillation signal;
    a divider configured to generate a division signal by dividing a signal having the oscillation frequency by a division ratio; and
    a frequency tuner configured to tune the oscillation frequency of the oscillation signal, dependent on a signal strength of the frequency difference signal, based on a result of comparing the frequency difference signal to the division signal.

2. The frequency calibrator of claim 1, wherein the input signal generator comprises an oscillator configured to operate at the oscillation frequency;
    the oscillator is further configured to receive the external signal, and output the input signal based on the external signal and the oscillation signal; and
    the frequency difference extractor comprises an envelope detector configured to detect an envelope signal from the input signal.

3. The frequency calibrator of claim 1, wherein the oscillation signal is output from an oscillator;
    the input signal generator comprises a frequency mixer configured to receive the oscillation signal and the external signal, and generate a mix signal as the input signal by mixing the oscillation signal and the external signal; and
    the frequency difference extractor comprises a pass filter configured to pass a signal within a threshold frequency bandwidth in the mix signal.

4. The frequency calibrator of claim 1, wherein the input signal generator comprises an oscillator configured to operate at the oscillation frequency; and
the oscillator comprises a capacitor bank configured to tune the oscillation frequency.

5. The frequency calibrator of claim 1, wherein the frequency tuner is further configured to tune the oscillation frequency using a binary search based on the result of comparing the frequency difference signal to the division signal.

6. The frequency calibrator of claim 1, wherein the input signal generator comprises an oscillator comprising a varactor pair; and
the frequency tuner comprises an analog phase lock loop (PLL) comprising a phase frequency detector (PFD), a main charge pump (CP), and a loop filter (LF).

7. The frequency calibrator of claim 1, wherein the frequency tuner is further configured to tune the oscillation frequency to minimize a frequency difference between the frequency difference signal and the division signal.

8. The frequency calibrator of claim 1, wherein the oscillation signal is output from an oscillator; and
the frequency tuner is further configured to:
decrease a capacitance of the oscillator in response to a frequency of the division signal being less than the frequency of the frequency difference signal, and
increase the capacitance of the oscillator in response to the frequency of the division signal being greater than the frequency of the frequency difference signal.

9. The frequency calibrator of claim 1, wherein the oscillation signal is output from an oscillator; and
the division ratio is determined based on the oscillation frequency, an injection current of the external signal, and an oscillation current of the oscillator.

10. The frequency calibrator of claim 1, wherein the input signal generator is further configured to receive the external signal having the external frequency within a predetermined frequency range; and
the frequency tuner is further configured to tune the oscillation frequency of the oscillation signal to a target frequency determined based on the division ratio and the external frequency.

11. The frequency calibrator of claim 1, wherein the divider is further configured to divide a signal generated by removing an envelope from the input signal by a division ratio N to obtain the division signal; and
the frequency tuner is further configured to tune the oscillation frequency of the oscillation signal to a frequency that is N/(N+1) times the external frequency, N being a real number greater than "0".

12. The frequency calibrator of claim 1, further comprising a signal strength detector configured to detect the signal strength of the frequency difference signal;
wherein the frequency calibrator is configured to:
continue a frequency calibration in response to the signal strength of the frequency difference signal exceeding a threshold strength, and
terminate the frequency calibration in response to the signal strength of the frequency difference signal being less than or equal to the threshold strength.

13. A frequency calibration method comprising:
generating an input signal based on an oscillation signal and an external signal;
extracting, from the input signal, a frequency difference signal having a frequency corresponding to a frequency difference between an external frequency of the external signal and an oscillation frequency of the oscillation signal;
generating a division signal by dividing a signal having the oscillation frequency by a division ratio; and
tuning the oscillation frequency of the oscillation signal, dependent on a signal strength of the frequency difference signal, based on a result of comparing the frequency difference signal to the division signal.

14. The frequency calibration method of claim 13, wherein the generating of the input signal comprises:
receiving the external signal; and
outputting the input signal based on the external signal and the oscillation signal; and
the extracting comprises detecting an envelope signal from the input signal as the frequency difference signal.

15. The frequency calibration method of claim 13, wherein the generating of the input signal comprises:
receiving the oscillation signal from an oscillator;
receiving the external signal; and
generating a mix signal as the input signal by mixing the oscillation signal and the external signal; and
the extracting comprises passing a signal within a threshold frequency bandwidth in the mix signal.

16. The frequency calibration method of claim 13, wherein the tuning comprises tuning the oscillation frequency using a binary search based on the result of comparing the frequency difference signal to the division signal.

17. The frequency calibration method of claim 13, wherein the generating of the input signal comprises receiving the external signal having the external frequency within a predetermined frequency range; and
the tuning comprises tuning the oscillation frequency to minimize a frequency difference between the frequency difference signal and the division signal.

18. The frequency calibration method of claim 13, further comprising:
detecting the signal strength of the frequency difference signal;
continuing a frequency calibration in response to the signal strength of the frequency difference signal exceeding a threshold strength; and
terminating the frequency calibration in response to the signal strength of the frequency difference signal being less than or equal to the threshold strength.

19. A non-transitory computer-readable medium storing instructions that, when executed by a processor, cause the processor to perform the method of claim 13.

20. A frequency calibration method comprising:
generating an input signal based on an oscillation signal and an external signal;
extracting, from the input signal, a frequency difference signal having a frequency corresponding to a frequency difference between an external frequency of the external signal and an oscillation frequency of the oscillation signal; and
changing an oscillation frequency of an oscillator in one direction in response to a signal strength of the frequency difference signal exceeding a threshold strength.

21. A frequency calibrator comprising:
an input signal generator configured to generate an input signal based on an external signal and an oscillation signal generated by a crystal-less oscillator;
a frequency difference extractor configured to extract, from the input signal, a frequency difference signal having a frequency corresponding to a frequency difference between an external frequency of the external signal and an oscillation frequency of the oscillation signal; and a frequency tuner configured to tune the oscillation frequency of the oscillation signal, dependent on a signal strength of the frequency difference signal, based on the frequency difference signal.

22. The frequency calibrator of claim 21, further comprising a divider configured to generate a division signal by dividing a signal having the oscillation frequency by a division ratio, wherein the frequency tuner is further configured to compare a frequency of the frequency difference signal to a frequency of the division signal, and tune the oscillation frequency of the oscillation signal based on a result of the comparing.

23. The frequency calibrator of claim 22, wherein the frequency tuner comprises:

a phase frequency detector configured to detect a frequency difference between the frequency of the frequency difference signal and the frequency of the division signal;

a signal strength detector configured to detect the signal strength of the frequency difference signal;

a processor configured to generate a control signal for tuning the oscillation frequency of the oscillator based on the frequency difference and the signal strength; and a frequency controller configured to tune the oscillation frequency of the oscillator based on the control signal and the signal strength.

24. The frequency calibrator of claim 23, wherein the processor comprises a binary searcher configured to generate the control signal by performing a binary search based on the frequency difference.

25. The frequency calibrator of claim 22, wherein the input signal generator comprises a varactor pair to tune the oscillation frequency of the oscillation signal; and the frequency tuner comprises:

a phase frequency detector configured to detect a frequency difference between the frequency of the frequency difference signal and the frequency of the division signal; and a charge pump and a loop filter configured to generate a control signal for tuning the oscillation frequency of the oscillator based on the frequency difference, and control the varactor pair based on the control signal to tune the oscillation frequency of the oscillator.

26. The frequency calibrator of claim 21, wherein the frequency tuner comprises:

a signal strength detector configured to detect the signal strength of the frequency difference signal; and a frequency controller configured to compare the signal strength of the frequency difference signal to a threshold, and tune the oscillation frequency of the oscillation signal based a result of the comparing.

27. The frequency calibrator of claim 21, wherein the input signal generator comprises a frequency mixer configured to mix the external signal and the oscillation signal to generate the input signal.

28. The frequency calibrator of claim 27, further comprising a divider configured to generate a division signal by dividing a signal having the oscillation frequency by a division ratio;

wherein the frequency tuner is further configured to compare a frequency of the frequency difference signal to a frequency of the division signal, and tune the oscillation frequency of the oscillation signal based on a result of the comparing.

29. The frequency calibrator of claim 28, wherein the frequency tuner comprises:

a phase frequency detector configured to detect a frequency difference between the frequency of the frequency difference signal and the frequency of the division signal; and a processor configured to generate a control signal for tuning the oscillation frequency of the oscillator based on the frequency difference; and the frequency calibrator further comprises a frequency controller configured to tune the oscillation frequency of the oscillator based on the control signal.

30. The frequency calibrator of claim 29, wherein the processor comprises a binary searcher configured to generate the control signal by performing a binary search based on the frequency difference.

31. The frequency calibrator of claim 28, wherein the input signal generator comprises a varactor pair to tune the oscillation frequency of the oscillation signal; and the frequency tuner comprises:

a phase frequency detector configured to detect a frequency difference between the frequency of the frequency difference signal and the frequency of the division signal; and a charge pump and a loop filter configured to generate a control signal for tuning the oscillation frequency of the oscillator based on the frequency difference, and control the varactor pair based on the control signal to tune the oscillation frequency of the oscillator.

32. A frequency calibrator comprising:

an input signal generator configured to generate an input signal based on an oscillation signal and an external signal;

a frequency difference extractor configured to extract, from the input signal, a frequency difference signal having a frequency corresponding to a frequency difference between an external frequency of the external signal and an oscillation frequency of the oscillation signal;

a divider configured to generate a division signal by dividing a signal having the oscillation frequency by a division ratio; and a frequency tuner configured to tune the oscillation frequency of the oscillation signal based on a result of comparing the frequency difference signal to the division signal, wherein the input signal generator comprises an oscillator configured to operate at the oscillation frequency;

the oscillator is further configured to receive the external signal, and output the input signal based on the external signal and the oscillation signal; and the frequency difference extractor comprises an envelope detector configured to detect an envelope signal from the input signal.

* * * * *